(12) United States Patent
Wang et al.

(10) Patent No.: US 10,431,295 B2
(45) Date of Patent: Oct. 1, 2019

(54) STATIC RANDOM ACCESS MEMORY AND METHOD OF CONTROLLING THE SAME

(71) Applicant: TAIWAN SEMICONDUCTOR MANUFACTURING COMPANY, LTD., Hsinchu (TW)

(72) Inventors: Li-Wen Wang, Taichung (TW); Chih-Yu Lin, Taichung (TW); Yen-Huei Chen, Jhudong Township (TW); Hung-Jen Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/291,443

(22) Filed: May 30, 2014

(65) Prior Publication Data

US 2015/0348598 A1    Dec. 3, 2015

(51) Int. Cl.
*G11C 7/00*    (2006.01)
*G11C 11/417*    (2006.01)
*G11C 11/419*    (2006.01)

(52) U.S. Cl.
CPC .......... *G11C 11/417* (2013.01); *G11C 11/419* (2013.01)

(58) Field of Classification Search
CPC ....... G11C 11/417; G11C 5/10; G11C 11/412; G11C 11/413
USPC .......................................................... 365/72
See application file for complete search history.

(56) References Cited

U.S. PATENT DOCUMENTS

| 7,570,525 | B2 * | 8/2009 | Nii ............................ | G11C 8/08 365/189.11 |
| 7,957,177 | B2 * | 6/2011 | Perisetty ........................ | 365/154 |
| 8,023,351 | B2 * | 9/2011 | Hirabayashi ............. | G11C 7/12 365/163 |
| 8,441,829 | B2 * | 5/2013 | Huang et al. ............... | 365/49.11 |
| 8,593,890 | B2 * | 11/2013 | Adams ................... | G11C 11/419 365/154 |
| 8,724,375 | B2 * | 5/2014 | Seshadri et al. ............... | 365/154 |
| 8,743,579 | B2 * | 6/2014 | Huang et al. ............... | 365/49.11 |
| 8,908,409 | B2 * | 12/2014 | Huang et al. ............... | 365/49.11 |
| 8,947,900 | B2 * | 2/2015 | Huang et al. ............... | 365/49.11 |
| 9,041,115 | B2 * | 5/2015 | Liaw .............................. | 257/369 |
| 9,064,550 | B2 * | 6/2015 | Chang ....................... | G11C 8/08 |
| 9,070,432 | B2 * | 6/2015 | Hsieh .................... | G11C 11/419 365/154 |
| 9,171,634 | B2 * | 10/2015 | Zheng ..................... | G11C 16/28 |
| 2007/0030741 | A1 * | 2/2007 | Nii ............................ | G11C 8/08 365/189.11 |
| 2009/0303826 | A1 * | 12/2009 | Perisetty ................... | 365/230.06 |
| 2010/0232244 | A1 * | 9/2010 | Hirabayashi ............. | G11C 7/12 365/208 |
| 2010/0315862 | A1 * | 12/2010 | Huang et al. ................. | 365/156 |
| 2012/0140551 | A1 * | 6/2012 | Arsovski .................. | G11C 7/12 365/154 |
| 2012/0287733 | A1 * | 11/2012 | van Winkelhoff ....... | G11C 7/02 365/189.16 |

(Continued)

*Primary Examiner* — Xiaochun L Chen
(74) *Attorney, Agent, or Firm* — Hauptman Ham, LLP

(57) ABSTRACT

A static random access memory (SRAM) that includes a memory cell comprising at least two p-type pass gates. The SRAM also includes a first data line connected to the memory cell, a second data line connected to the memory cell and a voltage control unit connected to the first data line, wherein the voltage control unit is configured to control the memory cell.

20 Claims, 21 Drawing Sheets

(56) References Cited

U.S. PATENT DOCUMENTS

| | | | |
|---|---|---|---|
| 2013/0100730 A1* | 4/2013 | Chang | G11C 11/418 365/154 |
| 2013/0148416 A1* | 6/2013 | Seshadri et al. | 365/154 |
| 2013/0250660 A1* | 9/2013 | Huang et al. | 365/156 |
| 2013/0286717 A1* | 10/2013 | Adams | G11C 11/419 365/154 |
| 2013/0292777 A1* | 11/2013 | Liaw | 257/369 |
| 2014/0204657 A1* | 7/2014 | Dally | 365/154 |
| 2014/0254248 A1* | 9/2014 | Huang et al. | 365/154 |
| 2014/0254249 A1* | 9/2014 | Huang et al. | 365/156 |
| 2014/0269091 A1* | 9/2014 | Zheng | G11C 16/28 365/185.21 |
| 2015/0131364 A1* | 5/2015 | Hsieh | G11C 11/419 365/154 |

* cited by examiner ized circuit (IC) industry has
STATIC RANDOM ACCESS MEMORY AND METHOD OF CONTROLLING THE SAME

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. As ICs have become smaller and more complex, operating voltages continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
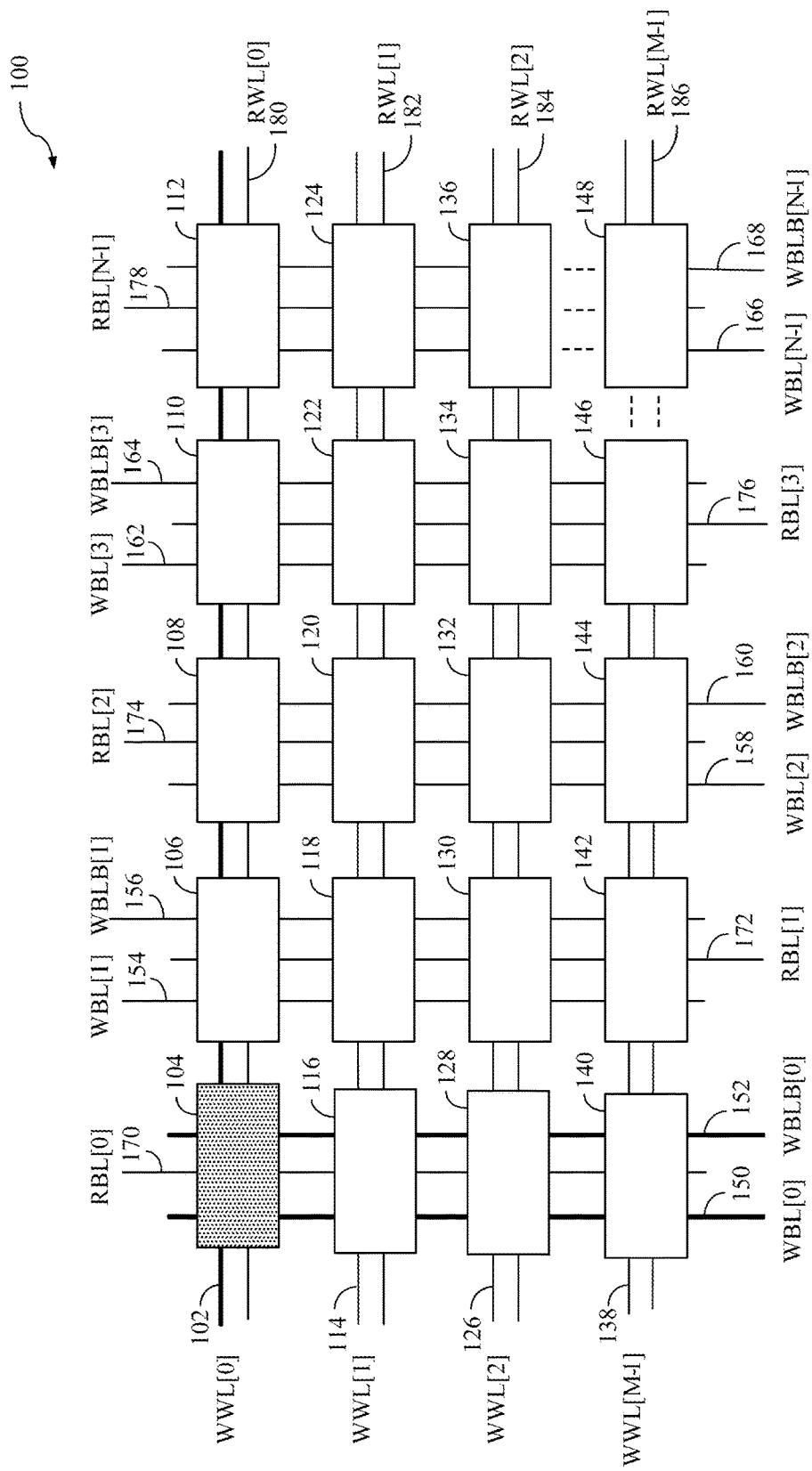
FIG. 1 is block diagram of a representative portion of a memory cell array in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of a representative portion of a memory cell array 100 in accordance with one or more embodiments. Memory cell array 100 comprises an array of memory cells including M rows by N columns, where M is an integer corresponding to the number of rows and N is an integer corresponding to the number of columns. In some embodiments, M is an integer ranging from 1 to 256. In some embodiments, N is an integer ranging from 1 to 256.

In some embodiments, memory cell array 100 comprises one or more single port (SP) static random access memory (SRAM) cells. In some embodiments, memory cell array 100 comprises one or more dual port (DP) SRAM cells. In some embodiments, memory cell array 100 comprises one or more two port (2P) SRAM cells. In some embodiments, write ports are used. In some embodiments, read ports are used. In some embodiments, additional write ports and/or read ports are used. In some embodiments, memory cell array 100 includes a single write port or read port. In some embodiments, memory cell array 100 includes more than one write port or read port.

M write word line (WWL) terminals (WWL[0]-WWL[M−1]) carry signals to activate corresponding rows in the memory cell array 100. WWL[0] terminal 102 is electrically connected to WWL terminals of memory cells 104, 106, 108, 110, 112 that form row 0 of the memory cell array 100. WWL[1] terminal 114 is electrically connected to WWL terminals of memory cells 116, 118, 120, 122, 124 that form row 1 of the memory cell array 100. WWL[2] terminal 126 is electrically connected to WWL terminals of memory cells 128, 130, 132, 134, 136 that form row 2 of the memory cell array 100. WWL[M−1] terminal 138 is electrically connected to WWL terminals of memory cells 140, 142, 144, 146, 148 that form row M−1 of the memory cell array 100.

N write bit line (WBL) terminals (WBL[0]-WBL[N−1]) and N write bit line bar (WBLB) terminals (WBLB[0]-WBLB[N−1]) carry data signals for storage in selected memory cells in a column in the memory cell array 100. WBL[0] terminal 150 and WBLB[0] terminal 152 are electrically connected to the corresponding WBL and WBLB terminals of memory cells 104, 116, 128, 140 that form column 0 of memory cell array 100. WBL[1] terminal 154 and WBLB[1] terminal 156 are electrically connected to the corresponding WBL and WBLB terminals of memory cells 106, 118, 130, 142 that form column 1 of memory cell array 100. WBL[2] terminal 158 and WBLB[2] terminal 160 are electrically connected to the corresponding WBL and WBLB terminals of memory cells 108, 120, 132, 144 that form column 2 of memory cell array 100. WBL[3] terminal 162 and WBLB[3] terminal 164 are electrically connected to the corresponding WBL and WBLB terminals of memory cells 110, 122, 134, 146 that form column 3 of memory cell array 100. WBL[N−1] terminal 166 and WBLB[N−1] terminal 168 are electrically connected to the corresponding WBL and WBLB terminals of memory cells 112, 124, 136, 148 that form column N−1 of memory cell array 100.

N read bit line (RBL) terminals (RBL[0]-RBL[N−1]) carry data signals in selected cells in a column in the memory cell array 100. RBL[0] terminal 170 is electrically connected to the RBL terminals of memory cells 104, 116, 128, 140 that form column 0 of memory cell array 100. RBL[1] terminal 172 is electrically connected to the RBL terminals of memory cells 106, 118, 130, 142 that form column 1 of memory cell array 100. RBL[2] terminal 174 is electrically connected to the RBL terminals of memory cells 108, 120, 132, 144 that form column 2 of memory cell array 100. RBL[3] terminal 176 is electrically connected to the RBL terminals of memory cells 110, 122, 134, 146 that form column 3 of memory cell array 100. RBL[N−1] terminal 178 is electrically connected to the RBL terminals of memory cells 112, 124, 136, 148 that form column N−1 of memory cell array 100.

M read word line (RWL) terminals (RWL[0]-RWL[M−1]) are used to activate a row of memory cells in the memory cell array 100. RWL[0] terminal 180 is electrically connected to the RWL terminals of row 0 of memory cell array 100. RWL[1] terminal 182 is electrically connected to the RWL terminals of row 1 of memory cell array 100. RWL[2] terminal 184 is electrically connected to the RWL terminals of row 2 of memory cell array 100. RWL[M−1] terminal 186 is electrically connected to the RWL terminals of row M−1 of memory cell array 100.

Figure 2A:
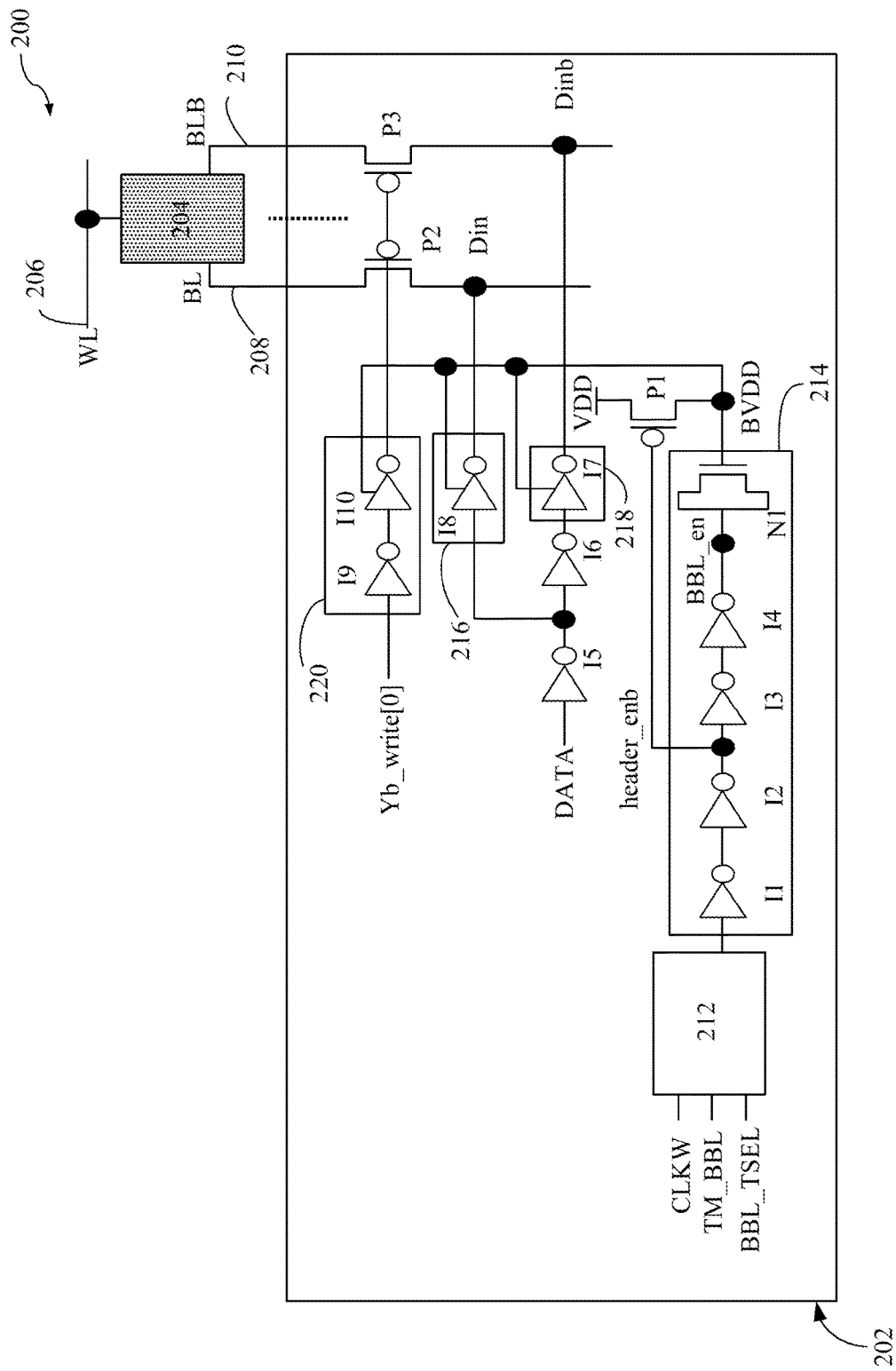
FIG. 2A is schematic diagram of a write logic cell in accordance with some embodiments.

FIG. 2A is a schematic diagram of a write logic cell 200 in accordance with one or more embodiments. Memory cell 204 is an embodiment of memory cell 104 shown in FIG. 1. Word line WL 206 is an embodiment of write word line WWL[0] 102 shown in FIG. 1. Bit line BL 208 is an embodiment of write bit line WBL[0] 150 shown in FIG. 1. Bit line bar BLB 210 is an embodiment of write bit line bar WBLB[0] 152 shown in FIG. 1.

Write logic cell 200 comprises memory cell 204 and bit line control unit 202. Memory cell 204 is connected to bit line control unit 202 by bit line BL 208 and bitline bar BLB 210. In some embodiments, one bit line control unit 202 is connected to one or more memory cells. In some embodiments, one or more bit line control units 202 are connected to at least one memory cell.

Bit line control unit 202 is configured to receive a clock signal CLKW, a tracking control signal TM_BBL, a select control signal BBL_TSEL, a data signal DATA and a multiplexer signal Yb_write[0]. Bit line control unit 202 is configured to send signal BL/BLB to memory cell 204 by the bit line BL 208 and bit line bar BLB 210. Bit line control unit 202 comprises a timing unit 212, a voltage control unit 214, a first write driver 216, a second write driver 218, a Y-Multiplexer 220, inverter I5, inverter I6, PMOS transistor P1, PMOS transistor P2 and PMOS transistor P3.

Timing unit 212 is configured to receive clock signal CLKW, tracking control signal TM_BBL and select control signal BBL_TSEL. The clock signal CLKW is, e.g., a logically low signal or a logically high signal. The tracking control signal TM_BBL is, e.g., a logically low signal or a logically high signal. In some embodiments, the select control signal BBL_TSEL is, e.g., a logically low signal or a logically high signal. In some embodiments, select control signal BBL_TSEL is a multiple bit signal with more than two logical states.

Timing unit 212 is configured to send a control signal to voltage control unit 214. In some embodiments, the control signal sent to the voltage control unit 214 is an embodiment of the first voltage control signal header_enb prior to the inverters I1 and I2. The first voltage control signal header_enb is, e.g., a logically low signal or a logically high signal. In some embodiments, timing unit 212 is configured to control the timing of the bit line control unit 202. In some embodiments, timing unit 212 is configured to control the pulse width of the first voltage control signal header_enb. In some embodiments, timing unit 212 is configured to control the rising edge or the falling edge of the first voltage control signal header_enb. Timing unit 212 is connected to voltage control unit 214. Timing unit 212 includes three inputs; one input of timing unit 212 is connected to the source of the clock signal CLKW, one input of timing unit 212 is connected to the source of the tracking control signal TM_BBL, and one input of timing unit 212 is connected to the source of the select control signal BBL_TSEL.

Voltage control unit 214 comprises inverter I1, inverter I2, inverter I3, inverter I4 and NMOS transistor N1. Voltage control unit 214 is configured to receive a signal from timing unit 212. Voltage control unit 214 is configured to send first voltage control signal header_enb to PMOS transistor P1. Voltage control unit 214 is configured to control a boosted voltage signal BVDD. In some embodiments, the boosted voltage signal BVDD ranges from about a first high signal level HIGH1 to about a second high signal level HIGH2. In some embodiments, first high signal level HIGH1 is substantially equal to VDD. In some embodiments, second high signal level HIGH2 is substantially equal to VDD+ΔVbvdd volts, where ΔVbvdd is a first boosted voltage level. In some embodiments, the first boosted voltage level ΔVbvdd ranges from about 0 volts to about 200 millivolts (mV). In some embodiments, a voltage control unit 214 is one or more voltage controllers. In some embodiments, a voltage controller is configured to selectively adjust the voltage of the memory cell.

Inverter I1 is connected to timing unit 212 and inverter I2. Inverter I1 is configured to receive a control signal from the timing unit 212. Inverter I1 is configured to send an inverted version of the control signal to inverter I2.

Inverter I2 is connected to inverter I1, inverter I3 and PMOS transistor P1. Inverter I2 is configured to receive the inverted version of the control signal from inverter I1. Inverter I2 is configured to send a first voltage control signal header_enb to inverter I3 and PMOS transistor P1.

Inverter I3 is connected to inverter I2, inverter I4 and PMOS transistor P1. Inverter I3 is configured to receive the first voltage control signal header_enb from inverter I3. Inverter I3 is configured to send an inverted version of the first voltage control signal header_enb to inverter I4.

Inverter I4 is connected to inverter I3 and NMOS transistor N1. Inverter I4 is configured to receive the inverted version of the first voltage control signal header_enb from inverter I3. Inverter I4 is configured to send a second voltage control signal BBL_en to NMOS transistor N1. In some embodiments, the second voltage control signal BBL_en is a delayed version of the first voltage control signal header_enb. The second voltage control signal BBL_en is, e.g., a logically low signal or a logically high signal.

The drain of NMOS transistor N1 is connected to the source of NMOS transistor N1. The gate of NMOS transistor N1 is connected to the drain of PMOS transistor P1, first write driver 216, second write driver 218 and Y-Multiplexer 220. In some embodiments, NMOS transistor N1 functions as a capacitor, since the drain and source terminals of the NMOS transistor N1 are coupled together. In some embodiments, NMOS transistor N1 is configured to control the boosted voltage signal BVDD. In some embodiments, the second voltage control signal BBL_en controls the charging/discharging of the NMOS transistor N1.

The gate of PMOS transistor P1 is connected to inverter I2 and inverter I3. The gate of PMOS transistor P1 is configured to receive the first voltage control signal header_enb. The source of PMOS transistor P1 is connected to voltage source VDD. The drain of PMOS transistor P1 is connected to the gate of NMOS transistor N1, first write driver 216, second write driver 218 and Y-Multiplexer 220. In some embodiments, the first voltage control signal header_enb selectively turns on/off PMOS transistor P1. In some embodiments, PMOS transistor P1 is configured to control the boosted voltage signal BVDD. In some embodiments, the first voltage control signal header_enb and the second voltage control signal BBL_en controls the charging/discharging of the NMOS transistor N1.

Inverter I5 is connected to inverter I6. Inverter I5 is configured to receive a data signal DATA. In some embodiments, the data signal DATA is, e.g., a logically low signal or a logically high signal. Inverter I5 is configured to send an inverted version of the data signal DATA to inverter I6 and first write driver 216.

First write driver 216 comprises inverter I8. Inverter I8 is connected to inverter I5, inverter I6, second write driver 218, Y-Multiplexer 220, PMOS transistor P1, PMOS transistor P2 and NMOS transistor N1. Inverter I8 is configured to receive an inverted version of the data signal DATA. Inverter I8 is configured to receive the boosted voltage signal BVDD. In some embodiments, inverter I8 is configured such that the boosted voltage signal BVDD is connected to the operating voltage terminal of the inverter I8. Inverter I8 is configured to send a data signal Din to PMOS transistor P2 by the bit line BL 208. In some embodiments, the data signal Din is, e.g., a logically low signal or a logically high signal. In some embodiments, the data signal Din is substantially equal to a bit line voltage signal BL. In some embodiments, the bit line voltage signal BL or bit line bar voltage signal BLB is a value ranging from a logically low level to about a second high signal level HIGH2'. In some embodiments, the second high signal level HIGH2' is substantially equal to VDD+ $\Delta$Vb1 volts, where $\Delta$Vb1 is a second boosted voltage level. In some embodiments, the second boosted voltage level $\Delta$Vb1 ranges from about 0 volts to about 150 mV. In some embodiments, the second boosted voltage level $\Delta$Vb1 is less than the first boosted voltage level $\Delta$Vbvdd.

Inverter I6 is connected to inverter I5, first write driver 216 and second write line driver 218. Inverter I6 is configured to receive an inverted version of the data signal DATA. Inverter I6 is configured to send a delayed version of the data signal DATA to the second write driver 218.

Second write driver 218 comprises inverter I7. Inverter I7 is connected to inverter I6, first write driver 216, Y-Multiplexer 220, PMOS transistor P1, PMOS transistor P3 and NMOS transistor N1. Inverter I7 is configured to receive the delayed version of the data signal DATA. Inverter I7 is configured to receive the boosted voltage signal BVDD. In some embodiments, inverter I7 is configured such that the boosted voltage signal BVDD is connected to the operating voltage terminal of the inverter I7. Inverter I7 is configured to send an inverted data signal Dinb to PMOS transistor P3 by the bit line bar BLB 210. In some embodiments, the inverted data signal Dinb is, e.g., a logically low signal or a logically high signal. In some embodiments, the inverted data signal Dinb is substantially equal to a bit line bar voltage signal BLB.

Y-Multiplexer 220 is connected to first write driver 216, second write driver 218, PMOS transistor P1, PMOS transistor P2, PMOS transistor P3 and NMOS transistor N1. Y-Multiplexer 220 is configured to receive a signal Yb_write [0]. Y-Multiplexer 220 is configured to receive boosted voltage signal BVDD. Y-Multiplexer 220 is configured to send a control signal to the gates of PMOS transistors P2 and P3. Y-Multiplexer 220 comprises inverter I9 and inverter I10.

Inverter I9 is connected to inverter I10. Inverter I9 is configured to receive a signal Yb_write[0]. In some embodiments, the signal Yb_write[0] is, e.g., a logically low signal or a logically high signal. Inverter I9 is configured to send an inverted version of the signal Yb_write[0] to inverter I10.

Inverter I10 is connected to inverter I9, first write driver 216, second write driver 218, PMOS transistor P1, PMOS transistor P2, PMOS transistor P3 and NMOS transistor N1. Inverter I10 is configured to receive an inverted version of signal Yb_write[0] and boosted voltage signal BVDD. In some embodiments, inverter I10 is configured such that the boosted voltage signal BVDD is connected to the operating voltage terminal of the inverter I10. Inverter I10 is configured to send a control signal to the gates of PMOS transistors P2 and P3.

The gate of PMOS transistor P2 is connected to the Y-Multiplexer 220. The gate of PMOS transistor P2 is configured to receive the control signal from the Y-Multiplexer 220. The source of PMOS transistor P2 is connected to memory cell 204 by the bit line BL 208. The drain of PMOS transistor P2 is connected to the first write driver 216. The drain of PMOS transistor P2 is configured to receive data signal Din.

The gate of PMOS transistor P3 is connected to the Y-Multiplexer 220. The gate of PMOS transistor P3 is configured to receive the control signal from the Y-Multiplexer 220. The source of PMOS transistor P3 is connected to memory cell 204 by the bit line bar BLB 210. The drain of PMOS transistor P3 is connected to the second write driver 218. The drain of PMOS transistor P3 is configured to receive inverted data signal Dinb.

Figure 2B:
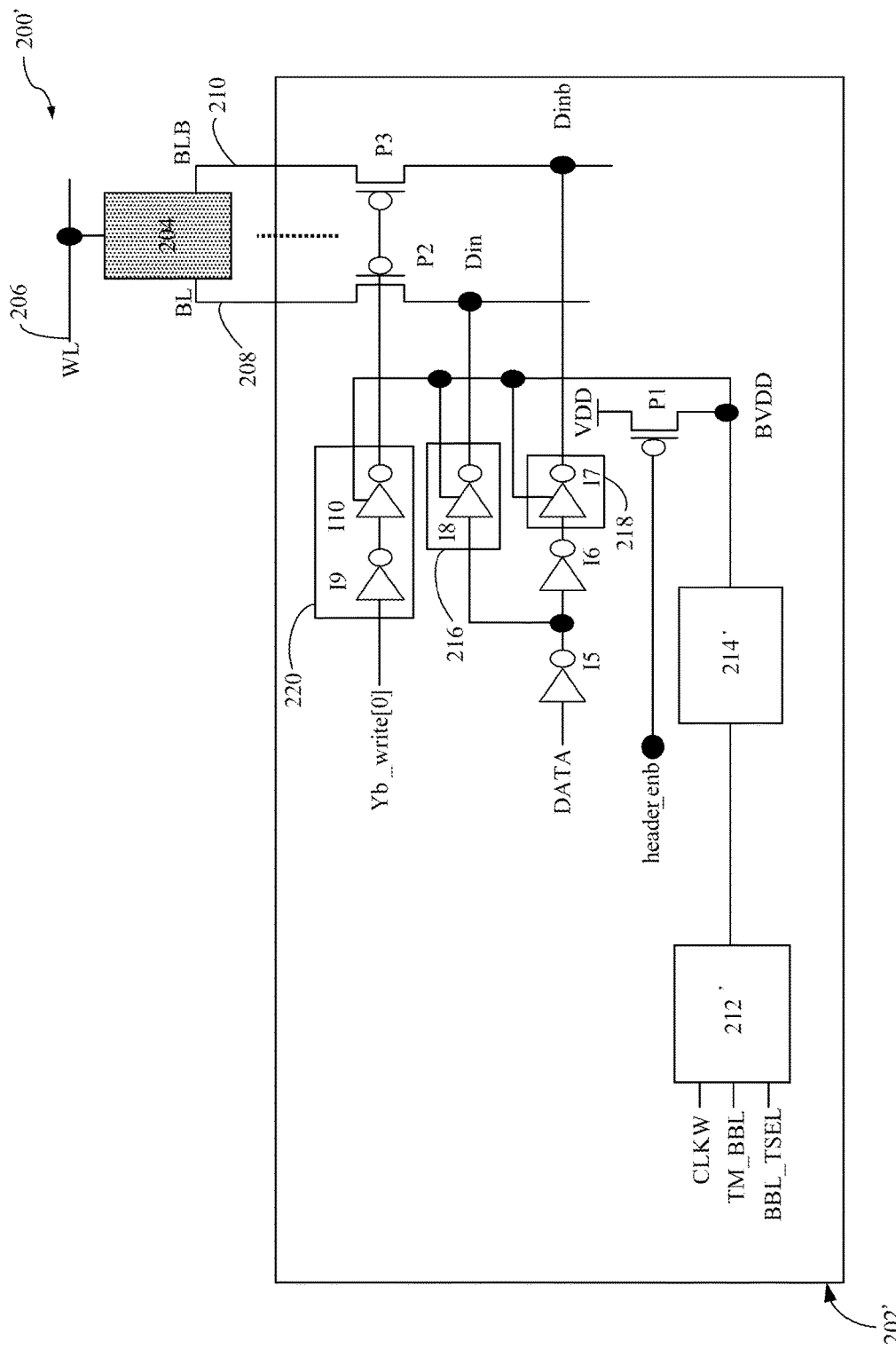
FIG. 2B is schematic diagram of a write logic cell in accordance with some embodiments.

FIG. 2B is a schematic diagram of a write logic cell 200 in accordance with one or more embodiments. Write logic cell 200' is an embodiment of write logic cell 200 shown in FIG. 2A with similar elements. Bit line control unit 202' is an embodiment of bit line control unit 202' shown in FIG. 2A with similar elements. In comparison with FIG. 2A, FIG. 2B comprises timing unit 212' instead of timing unit 212, and voltage control unit 214' instead of voltage control unit 214'. Timing unit 212' is an embodiment of timing unit 212 shown in FIG. 2A. Voltage control unit 214' is an embodiment of voltage control unit 214 shown in FIG. 2A.

Timing unit 212' is configured to receive clock signal CLKW, tracking control signal TM_BBL and select control signal BBL_TSEL. Timing unit 212' is configured to send a control signal to voltage control unit 214'. In some embodiments, timing unit 212' is configured to control the timing of the bit line control unit 202'. Timing unit 212' is connected to voltage control unit 214'. Timing unit 212' includes three inputs; one input of timing unit 212' is connected to the source of the clock signal CLKW, one input of timing unit 212' is connected to the source of the tracking control signal TM_BBL and one input of timing unit 212' is connected to the source of the select control signal BBL_TSEL.

Voltage control unit 214' is configured to receive a signal from timing unit 212'. Voltage control unit 214' is configured to control a boosted voltage signal BVDD. In some embodiments, a voltage control unit 214' is one or more voltage controllers. In some embodiments, a voltage controller is configured to selectively adjust the voltage of the memory cell.

The gate of PMOS transistor P1 is configured to receive the first voltage control signal header_enb. The gate of PMOS transistor P1 is connected the source of the first voltage control signal header_enb.

The source of PMOS transistor P1 is connected to voltage source VDD. The drain of PMOS transistor P1 is connected to the voltage control unit 214', first write driver 216, second write driver 218 and Y-Multiplexer 220. In some embodiments, the first voltage control signal header_enb selectively turns on/off PMOS transistor P1. In some embodiments, PMOS transistor P1 is configured to control the boosted voltage signal BVDD. In some embodiments, the first voltage control signal header_enb and the second voltage control signal BBL_en controls the charging/discharging of the NMOS transistor N1.

Figure 3A:
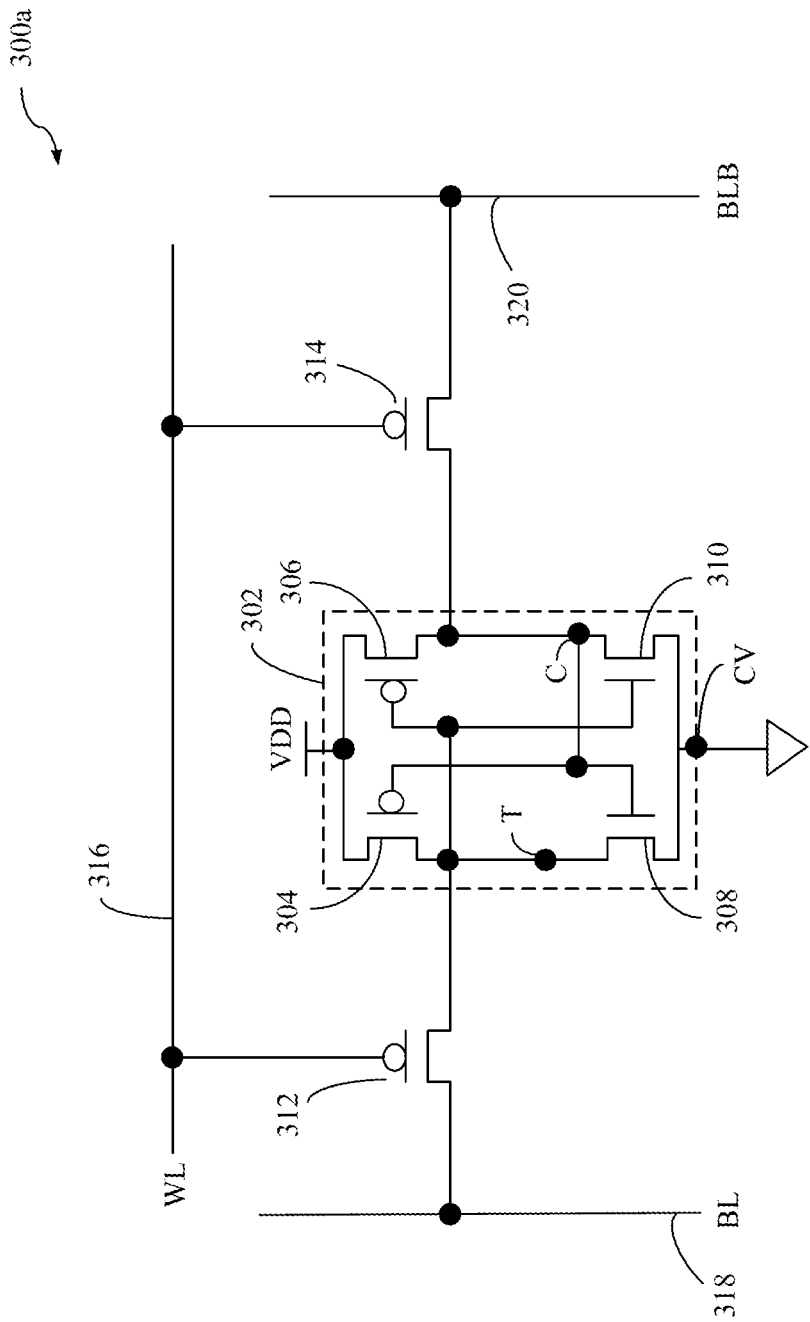
FIG. 3A is a schematic diagram of memory cell in accordance with some embodiments.

FIG. 3A is a schematic diagram of a memory cell 300a in accordance with one or more embodiments. Memory cell 300a is an embodiment of one or more memory cells shown in FIG. 1. In some embodiments, the memory cell 300a is a six transistor (6T) single port (SP) SRAM memory cell. In some embodiments, the memory cell 300a employs a number of transistors other than six. The memory cell 300a comprises a pair of cross-coupled inverters 302, first pass gate 312 and second pass gate 314.

The cross-coupled inverters 302 include two p-type metal oxide semiconductor (PMOS) transistors 304, 306 each having source terminals electrically connected to a power supply voltage (VDD) terminal. The two PMOS transistors 304, 306 each have drain terminals separately electrically connected to drain terminals of two n-type metal oxide semiconductor (NMOS) transistors 308, 310 at corresponding nodes T and C. Source terminals of NMOS transistors 308, 310 are electrically connected to node CV. In some embodiments, node CV is substantially equal to a logically low signal. In some embodiments, node CV is substantially equal to a ground voltage (VSS). A gate terminal of PMOS transistor 304 is electrically connected to a gate terminal of NMOS transistor 308 and the drain terminal of NMOS transistor 310. Similarly, a gate terminal of PMOS transistor 306 is electrically connected to a gate terminal of NMOS transistor 310 and the drain terminal of NMOS transistor 308.

First pass gate 312 is configured to selectively connect cross-coupled inverters 302 to a bit line BL 318. Second pass gate 314 is configured to selectively connect cross-coupled inverters 302 to a bit line bar BLB 320. First pass gate 312 and second pass gate 314 are both configured to be activated based on a signal supplied by a word line WL 316. In some embodiments, first pass gate 312 or second pass gate 314 is a PMOS transistor. In some embodiments, first pass gate 312 or second pass gate 314 include three-dimensional gate structures, e.g. fin field-effect-transistors (FinFET). Note that the term "bar" as used in this context indicates a logically inverted signal, for example, bit line bar BLB 320 carries a signal logically inverted from a signal carried by bit line BL 318.

In contrast with memory cells which include n-type transistors for pass gates, memory cell array 300a is connected to the bit line BL 318 and bit line bar BLB 320 by a logically low signal at a gate of first pass gate 312 and second pass gate 314.

As semiconductor devices are scaled down, a driving strength of a p-type transistor increases in comparison with a driving strength of an n-type transistor. The result is that higher currents are able to be conveyed through p-type transistors in scaled down semiconductor devices. By using p-type transistors for first pass gate 312 and second pass gate 314 for scaled down semiconductor devices, bit information stored in cross-coupled inverters 302 is conveyed to bit line BL 318 or bit line bar BLB 320 more rapidly in comparison with scaled down semiconductor devices which include n-type transistors for pass gates.

Figure 3B:
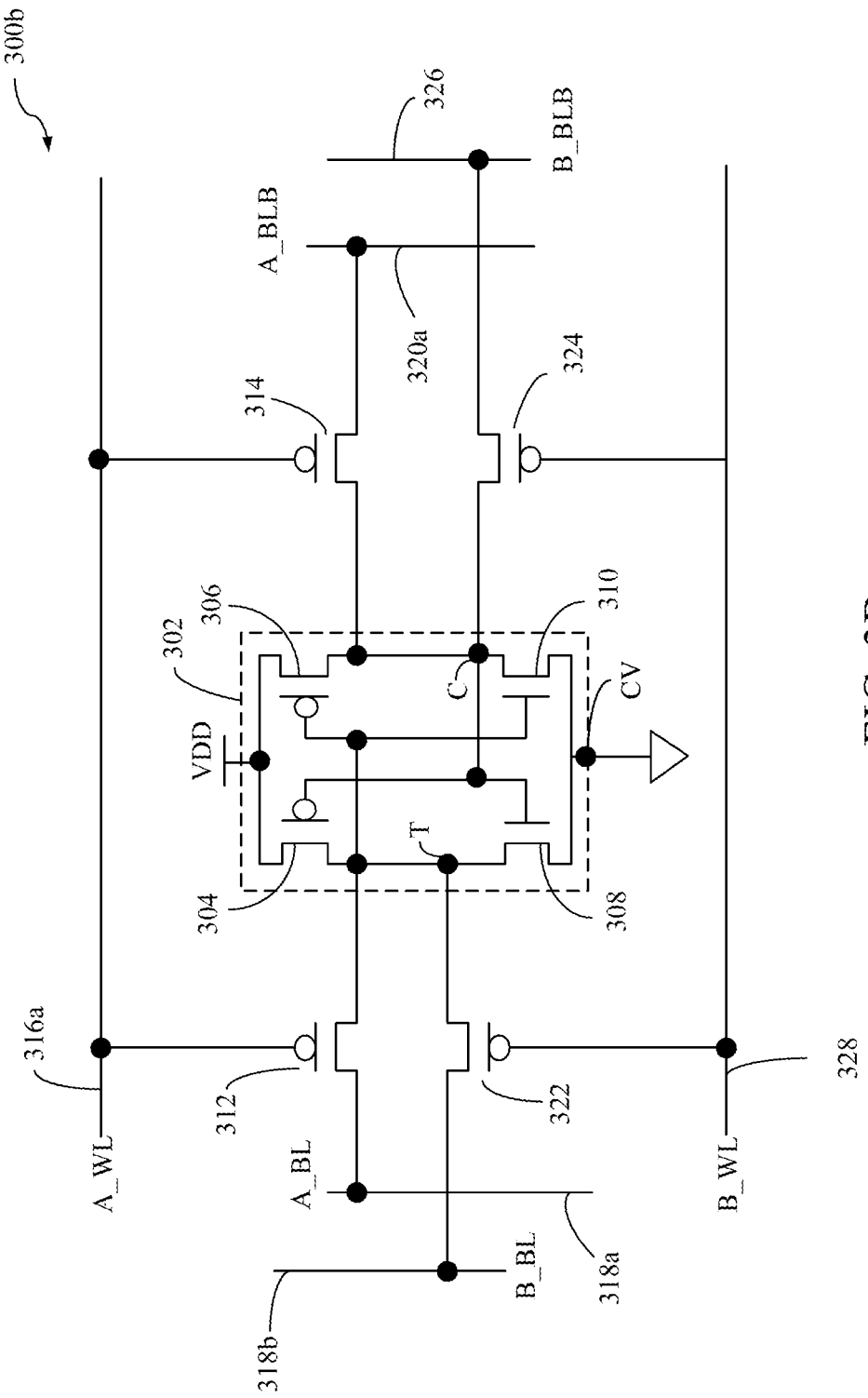
FIG. 3B is a schematic diagram of memory cell in accordance with some embodiments.

FIG. 3B is a schematic diagram of a memory cell 300b in accordance with one or more embodiments. Memory cell 300b is an embodiment of memory cell 300a (shown in FIG. 3a) with similar elements. In some embodiments, the memory cell 300b is an eight transistor (8T) dual port (DP) SRAM memory cell. In some embodiments, the memory cell 300b employs a number of transistors other than eight. The memory cell 300b comprises a pair of cross-coupled inverters 302, first pass gate 312, second pass gate 314, third pass gate 322 and fourth pass gate 324.

First pass gate 312 is configured to selectively connect cross-coupled inverters 302 to a first bit line A_BL 318a. Second pass gate 314 is configured to selectively connect cross-coupled inverters 302 to a first bit line bar A_BLB 320a. Third pass gate 322 is configured to selectively connect cross-coupled inverters 302 to a second bit line B_BL 318b. Fourth pass gate 326 is configured to selectively connect cross-coupled inverters 302 to a second bit line bar B_BLB 326. Both first pass gate 312 and second pass gate 314 are configured to be activated based on a signal supplied by a first word line A_WL 316a. Third pass gate 322 and fourth pass gate 324 are both configured to be activated based on a signal supplied by a second word line B_WL 328. In some embodiments, first pass gate 312 or second pass gate 314 is a PMOS transistor. In some embodiments, third pass gate 322 or fourth pass gate 324 is a PMOS transistor. In some embodiments, one or more of first pass gate 312, second pass gate 314 third pass gate 322 or fourth pass gate 324 include three-dimensional gate structures, e.g. FinFETs.

In contrast with memory cells which include n-type transistors for pass gates, memory cell array 300b is connected to the first bit line A_BL 318a, second bit line B_BL 318b, first bit line bar A_BLB 320a or fourth bit line bar B_BLB 326 by a logically low signal at a gate of first pass gate 312, second pass gate 314, third pass gate 322 or fourth pass gate 324.

Figure 3C:
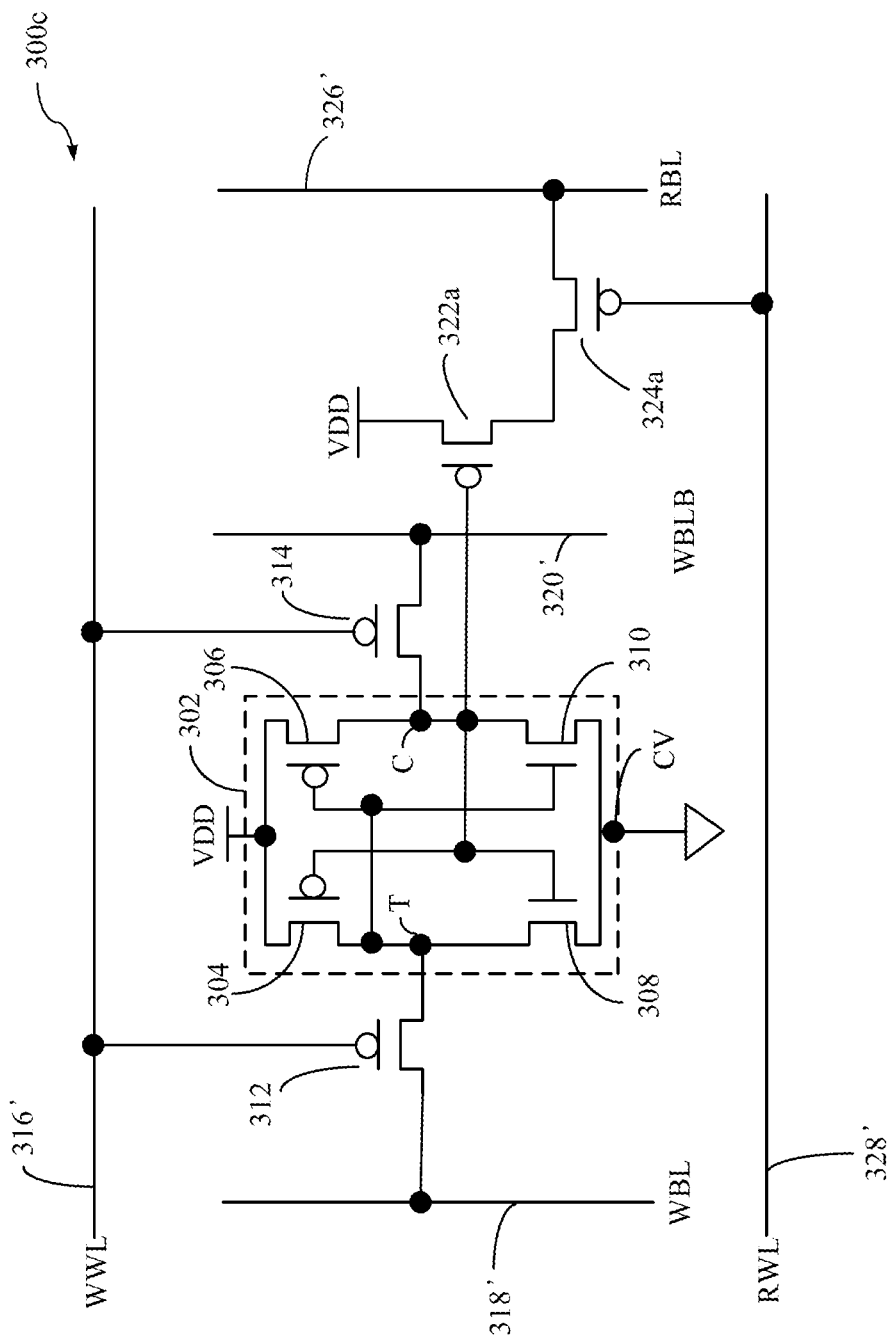
FIG. 3C is a schematic diagram of memory cell in accordance with some embodiments.

FIG. 3C is a schematic diagram of a memory cell 300c in accordance with one or more embodiments. Memory cell 300c is an embodiment of memory cell 300a (shown in FIG. 3a) with similar elements. In some embodiments, the memory cell 300c is an eight transistor (8T) two port (2P) SRAM memory cell. In some embodiments, the memory cell 300c employs a number of transistors other than eight. In comparison with the memory cell 300a (shown in FIG. 3a), memory cell 300c also includes a read port transistor 322a and a read bit line transistor 324a. Write word line WWL 316' is an embodiment of word line 316 shown in FIG. 3a. Write bit line WBL 318' is an embodiment of bit line 318 shown in FIG. 3a. Write bit line bar WBLB 320' is an embodiment of bit line bar 320 shown in FIG. 3a.

Read port transistor 322a is connected to read bit line transistor 324a. In some embodiments, read port transistor 322a and read bit line transistor 324a facilitate a read operation and a write operation to be performed on memory cell 300c during a same cycle. Read port transistor 322a is a p-type transistor. In some embodiments, read port transistor 322a includes a three-dimensional gate structure, e.g., FinFET. A gate of read port transistor 322a is connected to second pass gate 314 and the cross-coupled inverters 302 (by node C). A source of read port transistor 322a is connected to voltage source VDD. A drain of read port transistor 322a is connected to read bit line transistor 324a.

Read port transistor 322a is configured to selectively connect the voltage source VDD to read bit line transistor 324a based on a voltage level at node C of the cross-coupled inverters 302. In operation, when a logically high value is at node C of the cross-coupled inverters 302, read port transistor 322a is non-conductive, and read bit line transistor 324a is floating. When a logically low value is at node C of the cross-coupled inverters 302, read port transistor 322a is conductive and read bit line transistor 324a is connected to the voltage source VDD.

Read bit line transistor 324a is a p-type transistor. In some embodiments, read bit line transistor 324a includes a three-dimensional gate structure, e.g., FinFET. A gate of read bit line transistor 324a is configured to receive a signal from a read word line RWL 328'. A source of read bit line transistor 324a is connected to read port transistor 322a. A drain of read bit line transistor 324a is connected to read bit line RBL 326'.

Read bit line transistor 324a is configured to selectively connect the read bit line RBL 326' to read port transistor 322a. In operation, when a signal on read write line RWL 328' activates read bit line transistor 324a and the read bit line transistor 324a is floating (by read port transistor 322a), a voltage level on read bit line RBL 326' remains unchanged. When a signal on read write line RWL activates read bit line transistor 324a and the read bit line transistor 324a is connected to the voltage source VDD (by read port transistor 322a), a voltage level on read bit line RBL 326' is pulled up to the operating voltage (e.g., voltage source VDD or a logically high signal). A voltage level on read bit line RBL 326' is usable to determine bit information stored in cross-coupled inverters 302.

Figure 4:
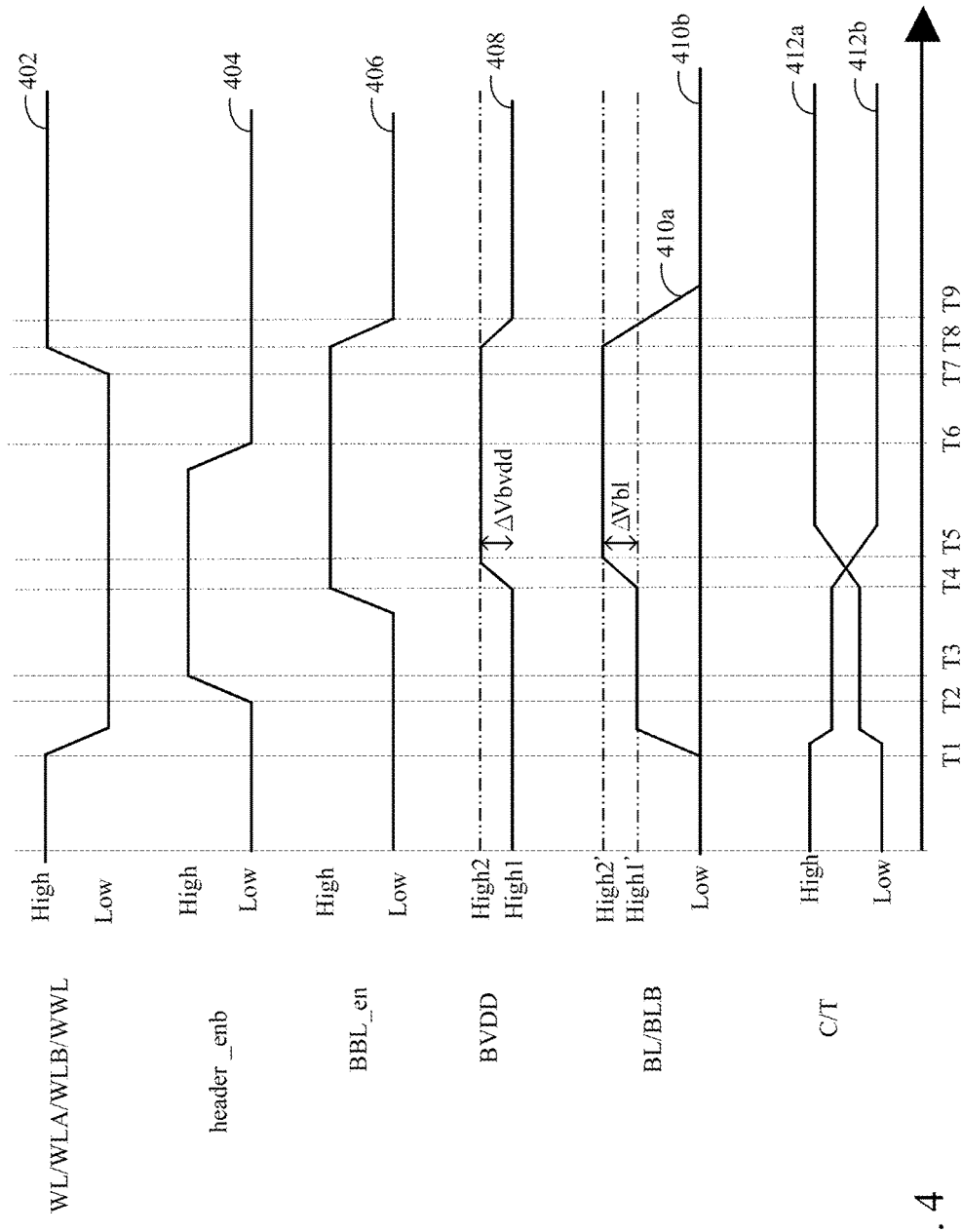
FIG. 4 is a waveform diagram of signals applied to a write logic cell of an SRAM in accordance with some embodiments.

FIG. 4 is a waveform diagram of signals applied to a write logic cell 200 of an SRAM in accordance with one or more embodiments. Curve 402 represents the signal on the word line WL (e.g., word line WL 316 shown in FIG. 3A, first word line A_WL 316a or second word line A_WL 328 shown in FIG. 3B and write word line WWL 316' shown in FIG. 3C); curve 404 represents the first voltage control signal header_enb; curve 406 represents the second voltage control signal BBL_en; curve 408 represents the boosted voltage signal BVDD; curves 410a, 410b represent the bit line/bit line bar signal BL/BLB; and curves 412a, 412b represent the signal on data nodes C/T of cross-coupled inverters 302. FIG. 4 shows waveforms of various signals when memory cell 204 is accessed for a write operation.

At time T1, curve 402 (e.g., word line signal WL) transitions from a logically high signal to a logically low signal. At time T1, curve 410b (e.g., bit line/bit line bar BL/BLB) transitions from a logically low signal to a first high signal level HIGH1'. In some embodiments, when curve 402 transitions to a logically low signal, the first pass gate 312 and the second pass gate 314 (as shown in FIG. 3A-3C) each turn-on connecting the bit line BL/bit line bar BLB to the cross-coupled inverters 302.

At time T2, curve 404 (e.g., first voltage control signal header_enb) starts transitioning from a logically low signal to a logically high signal.

At time T3, curve 404 (e.g., first voltage control signal header_enb) finishes transitioning from a logically low signal to a logically high signal. In some embodiments, when curve 404 transitions to a logically high signal, the PMOS transistor P1 (as shown in FIGS. 2A-2B) turns-off which disconnects the gate of the NMOS transistor N1 from the voltage source VDD.

At time T4, curve 406 (e.g., second voltage control signal BBL_en) transitions from a logically low signal to a logically high signal. At time T4, curve 408 (e.g., boosted voltage signal BVDD) transitions from a first high signal level HIGH1 to a second high signal level HIGH2. At time T4, curve 410a (e.g., bit line/bit line bar signal BL/BLB) transitions from a first high signal level HIGH1' to a second high signal level HIGH2'. At time T4, curve 412a transitions from an intermediate signal level to a logically high signal level and curve 412b transitions from an intermediate signal level to a logically low signal level. In some embodiments, the curves 412a, 412b represent the ability of cross-coupled inverters 302 to transition from a low logical state to a high logical state and vice versa for the storage of a unit of data in a memory cell 204.

In some embodiments, the first high signal level HIGH1 is substantially equal to voltage source VDD. In some embodiments, the second high signal level HIGH2 is substantially equal to VDD+$\Delta$Vbvdd, where $\Delta$Vbvdd is a first boosted voltage level. In some embodiments, the first signal level HIGH1' is substantially equal to voltage source VDD. In some embodiments, the second signal level HIGH2' is substantially equal to VDD+$\Delta$Vb1, where $\Delta$Vb1 is a second boosted voltage level. In some embodiments, NMOS transistor N1 functions as a capacitor since the source and drain are coupled together.

In some embodiments, a change in the first voltage control signal header_enb (e.g., curve 404) and the second voltage control signal BBL_en (e.g., curve 406), causes the NMOS transistor N1 to discharge resulting in a change in the boosted voltage signal BVDD (e.g., curve 408). In some embodiments, the change in the first voltage control signal header_enb (e.g., curve 404) directly results in a change in the second voltage control signal BBL_en (e.g., curve 406). In some embodiments, the change in the first voltage control signal header_enb (e.g., curve 404) or the second voltage control signal BBL_en (e.g., curve 406), triggers a corresponding change in both the boosted voltage signal BVDD (e.g., curve 408) and the bit line/bit line bar signal BL/BLB (e.g., curve 410a). In some embodiments, a change in the boosted voltage signal BVDD (e.g., curve 408) results in a corresponding change of the bit line/bit line bar signal BL/BLB (e.g., curve 410a).

At time T5, curve 408 (e.g., boosted voltage signal BVDD) finishes transitioning to a second high signal level HIGH2. At time T5, curve 410a (e.g., bit line/bit line bar signal BL/BLB) finishes transitioning to a second high signal level HIGH2'.

At time T6, curve 404 (e.g., first voltage control signal header_enb) transitions from a logically high signal to a logically low signal.

At time T7, curve 402 begins transitioning to a logically high signal.

At time T8, curve 402 finishes transitioning to a logically high signal. In some embodiments, when curve 402 transitions to a logically high signal, the first pass gate 312 and the second pass gate 314 (as shown in FIG. 3A-3C) each turn-off and disconnect the bit line BL/bit line bar BLB from the cross-coupled inverters 302. In some embodiments, a single write cycle of the word line is represented by curve 402. At time T8, curve 406 (e.g. second voltage control signal BBL_en) transitions from a logically high signal to a logically low signal. At time T8, curve 408 (e.g. Boosted voltage signal BVDD) transitions from a second high signal level HIGH2 to a first high signal level HIGH1. At time T8, curve 410a (e.g., bit line/bit line bar signal BL/BLB) transitions from a second high signal level HIGH2' to a logically low signal (e.g., curve 410b).

At time T9, curve 406 (e.g., second voltage control signal BBL_en) and curve 408 (e.g., boosted voltage signal BVDD) finish transitioning to a logically low signal.

In some embodiments, curves 410a, 410b (e.g., bit line signal BL and bit line bar signal BLB) transition to a voltage level greater than voltage source VDD which strengthens the capability of the first pass gate 312, the second pass gate 314, third pass gate 322 and fourth pass gate 324 (as shown in FIGS. 3A-3C). In some embodiments, when curves 410a, 410b (e.g., bit line signal BL and bit line bar signal BLB) transition to a voltage level greater than voltage source VDD, the operating region (e.g., VCCmin) of memory cell 204 is improved. In some embodiments, the operating region (e.g., VCCmin) of memory cell 204 is the minimum voltage at which the memory cell can reliably operate. In some embodiments, by controlling the pulse width of the first voltage control signal header_enb, the pulse width of the boosted voltage signal BVDD is controlled. In some embodiments, by controlling the pulse width of the first voltage control signal header_enb, the length of time the bit line signal BL or bit line bar signal BLB is raised or lifted up to the second high signal HIGH2' is controlled.

Figure 5:
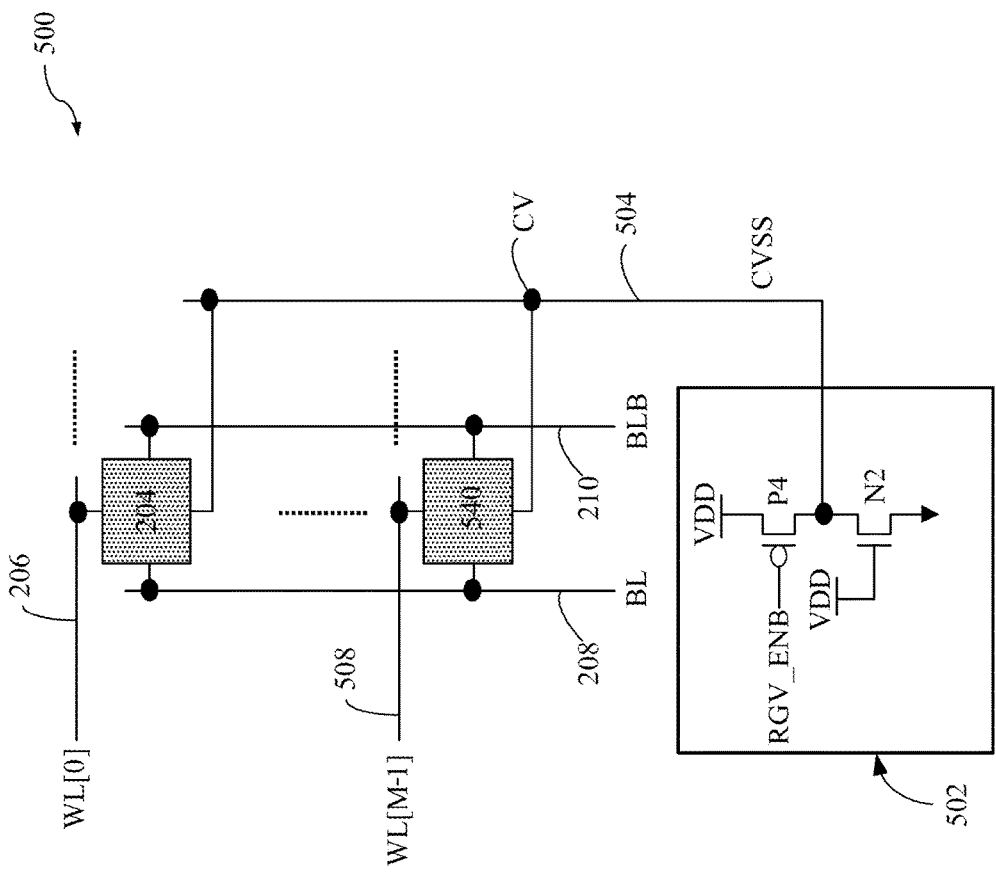
FIG. 5 is schematic diagram of a write logic cell in accordance with some embodiments.

FIG. 5 is a schematic diagram of a write logic cell 500 in accordance with one or more embodiments. Memory cell 204 is an embodiment of memory cell 104 shown in FIG. 1. Memory cell 540 is an embodiment of memory cell 140 shown in FIG. 1. Word line WL[0] 206 is an embodiment of write word line WWL[0] 102 shown in FIG. 1. Word line WL[M−1] 508 is an embodiment of write word line WWL[M−1] 138 shown in FIG. 1. Bit line BL 208 is an embodiment of write bit line WBL[0] 150 shown in FIG. 1. Bit line bar BLB 210 is an embodiment of write bit line bar WBLB[0] 152 shown in FIG. 1.

Write logic cell 500 comprises a voltage control unit 502 connected to memory cell 204 and memory cell 540. Memory cell 204 and memory cell 540 are connected to voltage control unit 502 by CV line 504 at node CV. Memory cell 204 and memory cell 540 are connected to each other by bit line BL 208 and bit line bar BLB 210. In some embodiments, voltage control unit 502 is connected to one or more memory cells in memory cell array 100. In some embodiments, a plurality of voltage control units 502 are each connected to one or more memory cells in memory cell array 100. In some embodiments, CV line 504 is a data line connected to VSS.

Voltage control unit 502 is configured to receive a first voltage signal RGV_ENB. Voltage control unit 502 is configured to control a second voltage signal CVSS on CV line 504. Voltage control unit 502 comprises an NMOS transistor N2 and a PMOS transistor P4. In some embodiments, voltage control unit 502 is one or more voltage controllers. In some embodiments, a voltage controller is configured to selectively adjust the voltage of the memory cell.

The gate of PMOS transistor P4 is connected to the source of first voltage signal RGV_ENB. The gate of PMOS transistor P4 is configured to receive the first voltage signal RGV_ENB. The source of PMOS transistor P4 is connected to voltage source VDD. The drain of PMOS transistor P4 is connected to the drain of NMOS transistor N2 and memory cells 204 and 540. In some embodiments, the first voltage signal RGV_ENB selectively turns on/off PMOS transistor P4. In some embodiments, PMOS transistor P4 is configured to control the second voltage signal CVSS. In some embodiments, the first voltage signal RGV_ENB selectively turns on/off PMOS transistor P4 which selectively connects/disconnects the drain of NMOS transistor N2 to voltage source VDD.

The gate of NMOS transistor N2 is connected to voltage source VDD. The drain of NMOS transistor N2 is connected to the drain of PMOS transistor P4 and memory cells 204, 540. The source of NMOS transistor N2 is connected to ground.

Figures 6A, 6B:
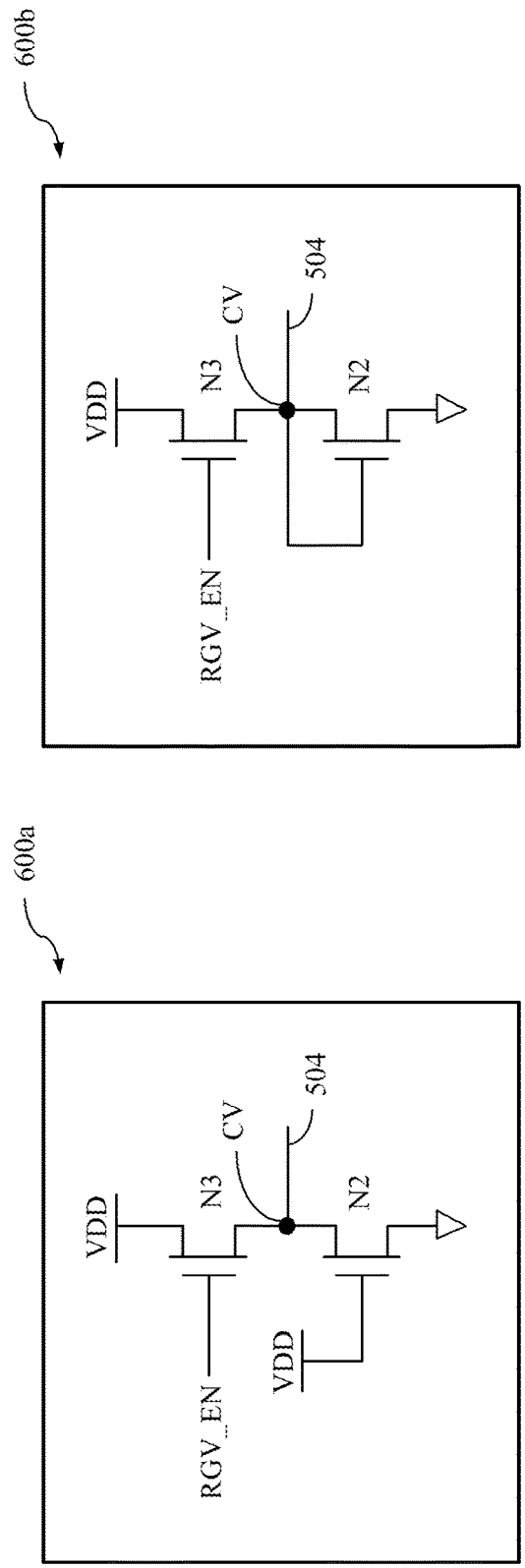
FIG. 6A is schematic diagram of a voltage control unit in accordance with some embodiments.
FIG. 6B is schematic diagram of a voltage control unit in accordance with some embodiments.

FIG. 6A is a schematic diagram of a voltage control unit 600a in accordance with one or more embodiments. Voltage control unit 600a is an embodiment of the voltage control unit 502 shown in FIG. 5 with similar elements.

Voltage control unit 600a is configured to receive inverted first voltage signal RGV_EN. Voltage control unit 600a is configured to control a second voltage signal CVSS on CV line 504. Voltage control unit 600a comprises an NMOS transistor N2 and an NMOS transistor N3. In some embodiments, voltage control unit 600a is one or more voltage controllers. In some embodiments, a voltage controller is configured to selectively adjust the voltage of the memory cell.

The gate of NMOS transistor N2 is connected to voltage source VDD. The drain of NMOS transistor N2 is connected to the drain of PMOS transistor P4 and memory cells 204, 540. The source of NMOS transistor N2 is connected to ground.

The gate of NMOS transistor N3 is connected to the source of inverted first voltage signal RGV_EN. The gate of NMOS transistor N3 is configured to receive inverted first voltage signal RGV_EN. The drain of NMOS transistor N3 is connected to voltage source VDD. The source of NMOS transistor N3 is connected to the drain of NMOS transistor N2 and memory cells 204 and 540. In some embodiments, inverted first voltage signal RGV_EN selectively turns on/off NMOS transistor N3. In some embodiments, NMOS transistor N3 is configured to control the second voltage signal CVSS. In some embodiments, inverted first voltage signal RGV_EN selectively turns on/off NMOS transistor N3 which connects the drain of NMOS transistor N2 to voltage source VDD.

FIG. 6B is a schematic diagram of a voltage control unit 600b in accordance with one or more embodiments. Voltage control unit 600b is an embodiment of the voltage control unit 502 shown in FIG. 5 with similar elements.

Voltage control unit 600b is configured to receive inverted first voltage signal RGV_EN. Voltage control unit 600b is configured to control second voltage signal CVSS on CV line 504. Voltage control unit 600b comprises an NMOS transistor N2 and an NMOS transistor N3. In some embodiments, voltage control unit 600b is one or more voltage controllers. In some embodiments, a voltage controller is configured to selectively adjust the voltage of the memory cell.

NMOS transistor N2 is connected in a diode configuration such that the gate of NMOS transistor N2 is connected to the drain of NMOS transistor N2. The gate and drain of NMOS transistor N2 are connected to the source of NMOS transistor N3 and memory cells 204, 540. The source of NMOS transistor N2 is connected to ground.

The gate of NMOS transistor N3 is connected to the source of inverted first voltage signal RGV_EN. The gate of NMOS transistor N3 is configured to receive inverted first voltage signal RGV_EN. The drain of NMOS transistor N3 is connected to voltage source VDD. The source of NMOS transistor N3 is connected to the drain of NMOS transistor N2 and memory cells 204 and 540. In some embodiments, inverted first voltage signal RGV_EN selectively turns on/off NMOS transistor N3. In some embodiments, NMOS transistor N3 is configured to control the second voltage signal CVSS. In some embodiments, inverted first voltage signal RGV_EN selectively turns on/off NMOS transistor N3 which connects the drain of NMOS transistor N2 to voltage source VDD.

Figures 7A, 7B:
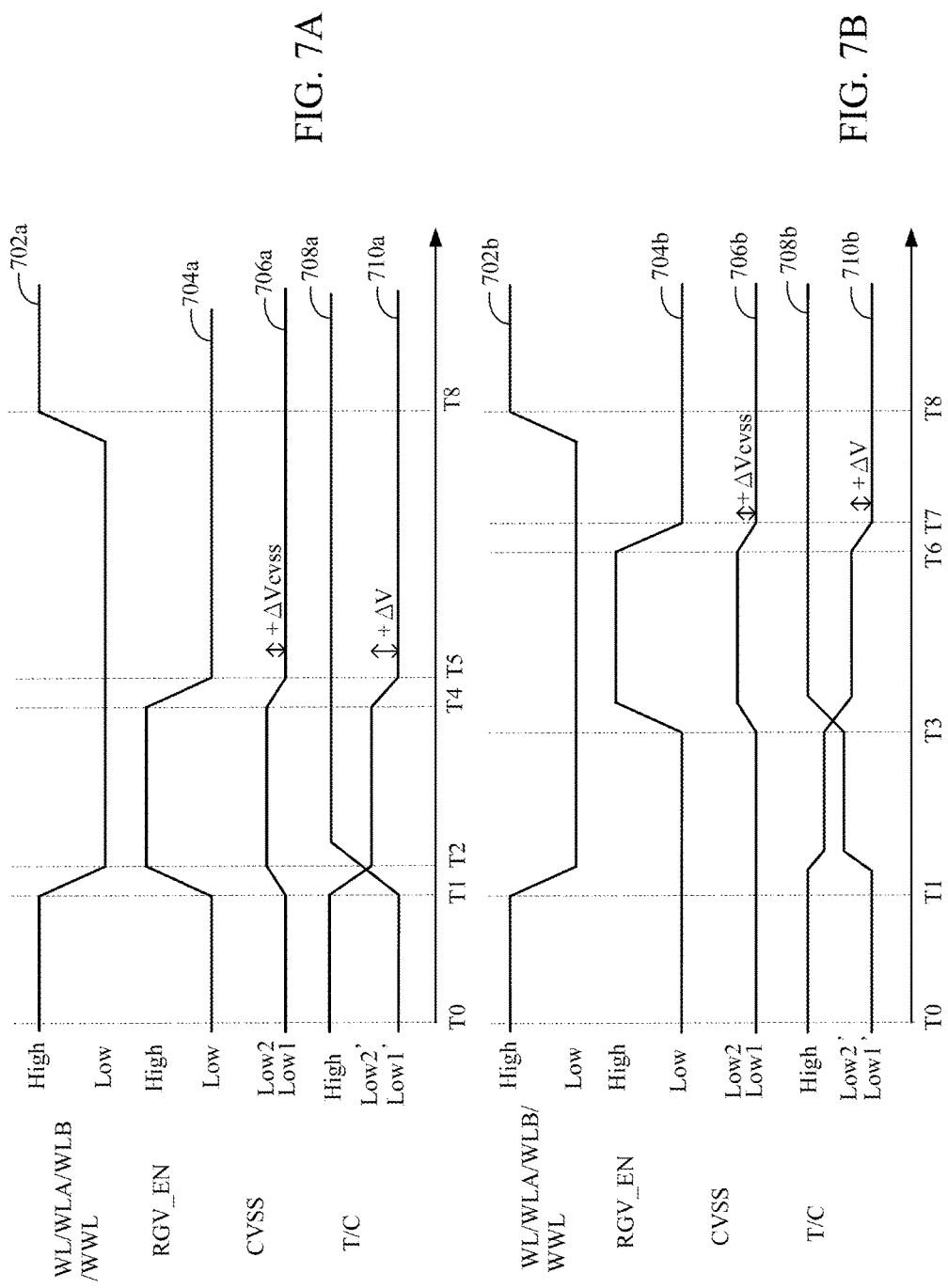
FIG. 7A is a waveform diagram of signals applied to a write logic cell of an SRAM for a write operation in accordance with one or more embodiments.
FIG. 7B is a waveform diagram of signals applied to a write logic cell of an SRAM for a write operation in accordance with one or more embodiments.

FIGS. 7A and 7B are waveform diagrams of signals applied to write logic cell 500 of an SRAM for a write operation in accordance with one or more embodiments. Curves 702a, 702b represent the signal on the word line WL (e.g., word line WL 316 shown in FIG. 3A, first word line A_WL 316a or second word line A_WL 328 shown in FIG. 3B and write word line WWL 316' shown in FIG. 3C); curves 704a, 704b represent inverted first voltage signal RGV_EN; curves 706a, 706b represent the second voltage signal CVSS and curves 708a, 708b, 710a, 710b represent the signal on data nodes C/T of cross-coupled inverters 302.

FIG. 7A is a waveform diagram of signals applied to write logic cell 500 of an SRAM for a write operation in accordance with one or more embodiments.

At time T1, curve 702a (e.g., word line signal WL) transitions from a logically high signal to a logically low signal. In some embodiments, when curve 702a transitions to a logically low signal, the first pass gate 312 and the second pass gate 314 (as shown in FIGS. 3A-3C) each turn-on connecting the bit line BL/bit line bar BLB to the cross-coupled inverters 302. At time T1, curve 704a (e.g., inverted first voltage signal RGV_EN) transitions from a logically low signal to a logically high signal. At time T1, curve 706a (e.g., second voltage signal CVSS) transitions from a first low signal level LOW1 to a second low signal level LOW2. At time T1, curve 708a transitions from a first low signal level LOW1' to a second low signal level LOW2' and curve 710a transitions from a logically high signal to a second low signal level LOW2'. In some embodiments, curves 708a, 710a represent the ability of cross-coupled inverters 302 to transition from a low logical state to a high logical state and vice versa for the storage of a unit of data in memory cells 204 and 540.

In some embodiments, the first low signal level LOW1 is substantially equal to VSS. In some embodiments, the second low signal level LOW2 is substantially equal to VSS+ΔVcvss, where ΔVcvss is a lifted voltage level. In some embodiments, the second low signal level LOW2 is a first intermediate voltage level which ranges from about the first low signal level LOW1 to about a logically high signal. In some embodiments, the lifted voltage level ΔVcvss ranges from about 0 volts to about 200 mV. In some embodiments, voltage VSS is substantially equal to ground. In some embodiments, voltage VSS is substantially equal to a negative voltage supply.

In some embodiments, the first low signal level LOW1' is substantially equal to voltage VSS. In some embodiments, the second signal level LOW2' is substantially equal to VSS+ΔV, where ΔV is a data voltage difference. In some embodiments, the second low signal level LOW2' is a second intermediate voltage level which ranges from about the first low signal level LOW1' to about a logically high signal. In some embodiments, the data voltage difference ΔV ranges from about 0 volts to about 150 mV.

In some embodiments, a change in inverted first voltage signal RGV_EN (e.g., curve 704a) or first voltage signal RGV_ENB, causes PMOS transistor P4 shown in FIG. 5 (or NMOS transistor N3 shown in FIGS. 7A and 7B) to turn on/off, resulting in a boost in second control voltage signal CVSS. In some embodiments, a change in inverted first voltage signal RGV_EN (e.g., curve 704a) or second control voltage signal CVSS results in a change in curves 708a, 710a (e.g., the store data flip time of cross-coupled inverters 302) by data voltage difference ΔV.

At time T2, curve 702a (e.g., word line signal WL) finishes transitioning to a logically low signal. At time T2, curve 704a (e.g., inverted first voltage signal RGV_EN) finishes transitioning to a logically high signal. At time T2, curve 706a (e.g., second voltage signal CVSS) finishes transitioning to a second low signal level LOW2.

At time T4, curve 704a (e.g., inverted first voltage signal RGV_EN) transitions from a logically high signal to a logically low signal. At time T4, curve 706a (e.g., second voltage signal CVSS) transitions from a second low signal level LOW2 to a first low signal level LOW1. At time T4, curve 708a reaches a logically high signal, and curve 710a transitions from a second low signal level LOW2' to a first low signal level LOW1'.

At time T5, curve 704a (e.g., inverted first voltage signal RGV_EN) finishes transitioning to a logically low signal. At time T5, curve 706a (e.g., second voltage signal CVSS) finishes transitioning to a first low signal level LOW1. At time T5, curve 710a finishes transitioning to a first low signal level LOW1'.

At time T8, curve 702a transitions to a logically high signal. In some embodiments, when curve 702a transitions to a logically high signal, the first pass gate 312 and the second pass gate 314 (as shown in FIG. 3A-3C) each turn-off and disconnect the bit line BL/bit line bar BLB from the cross-coupled inverters 302. In some embodiments, a single write cycle of the word line is represented by curve 702a.

FIG. 7B is a waveform diagram of signals applied to write logic cell 500 of an SRAM for a write operation in accordance with one or more embodiments.

At time T1, curve 702b (e.g., word line signal WL) transitions from a logically high signal to a logically low signal.

At time T3, curve 704b (e.g., inverted first voltage signal RGV_EN) transitions from a logically low signal to a logically high signal. At time T3, curve 706b (e.g., second voltage signal CVSS) transitions from a first low signal level LOW1 to a second low signal level LOW2. After time T3, curve 708b transitions to a logically high signal and curve 710b transitions from an intermediate signal level to a second low signal level LOW2'. In some embodiments, curves 708b, 710b represent the ability of cross-coupled inverters 302 to transition from a low logical state to a high logical state and vice versa for the storage of a unit of data in memory cells 204 and 540.

At time T6, curve 704b (e.g., inverted first voltage signal RGV_EN) transitions from a logically high signal to a logically low signal. At time T6, curve 706b (e.g., second voltage signal CVSS) transitions from a second low signal level LOW2 to a first low signal level LOW1. At time T6, curve 710b transitions from a second low signal level LOW2' to a first low signal level LOW1'.

At time T7, curve 704b (e.g., inverted first voltage signal RGV_EN) finishes transitioning to a logically low signal. At time T7, curve 706b (e.g., second voltage signal CVSS) finishes transitioning to a first low signal level LOW1. At time T7, curve 710b finishes transitioning to a first low signal level LOW1'.

At time T8, curve 702a transitions to a logically high signal. In some embodiments, when curve 702a transitions to a logically high signal, the first pass gate 312 and the second pass gate 314 (as shown in FIG. 3A-3C) each turn-off and disconnect the bit line BL/bit line bar BLB from the cross-coupled inverters 302. In some embodiments, a single write cycle of the word line is represented by curve 702a.

As shown in FIGS. 7A and 7B, by controlling the timing of the rising edge or the falling edge of the first voltage signal RGV_EN, the rising edge or the falling edge of the second voltage signal CVSS and the value of the second voltage signal CVSS are similarly controlled. As shown in FIGS. 7A and 7B, by controlling the timing of the rising edge or the falling edge of the first voltage signal RGV_EN or second voltage signal CVSS, the store data flip time of cross-coupled inverters 302 (e.g., curves 708a, 710a) is also changed. In some embodiments, the pulse width of inverted first control signal RGV_EN or first control signal RGV_ENB controls the pulse width of second voltage signal CVSS. In some embodiments, when curves 706a, 706b (e.g., second voltage signal CVSS) transition to a voltage level greater than VSS, the NMOS transistors 308 and 310 (shown in FIGS. 3A-3C) are weakened and the operating region (e.g., VCCmin) of memory cells 204, . . . , 540 are improved. In some embodiments, the operating region (e.g., VCCmin) of memory cells 204, . . . , 540 are the minimum voltage at which the memory cell can reliably operate.

Figure 8A:
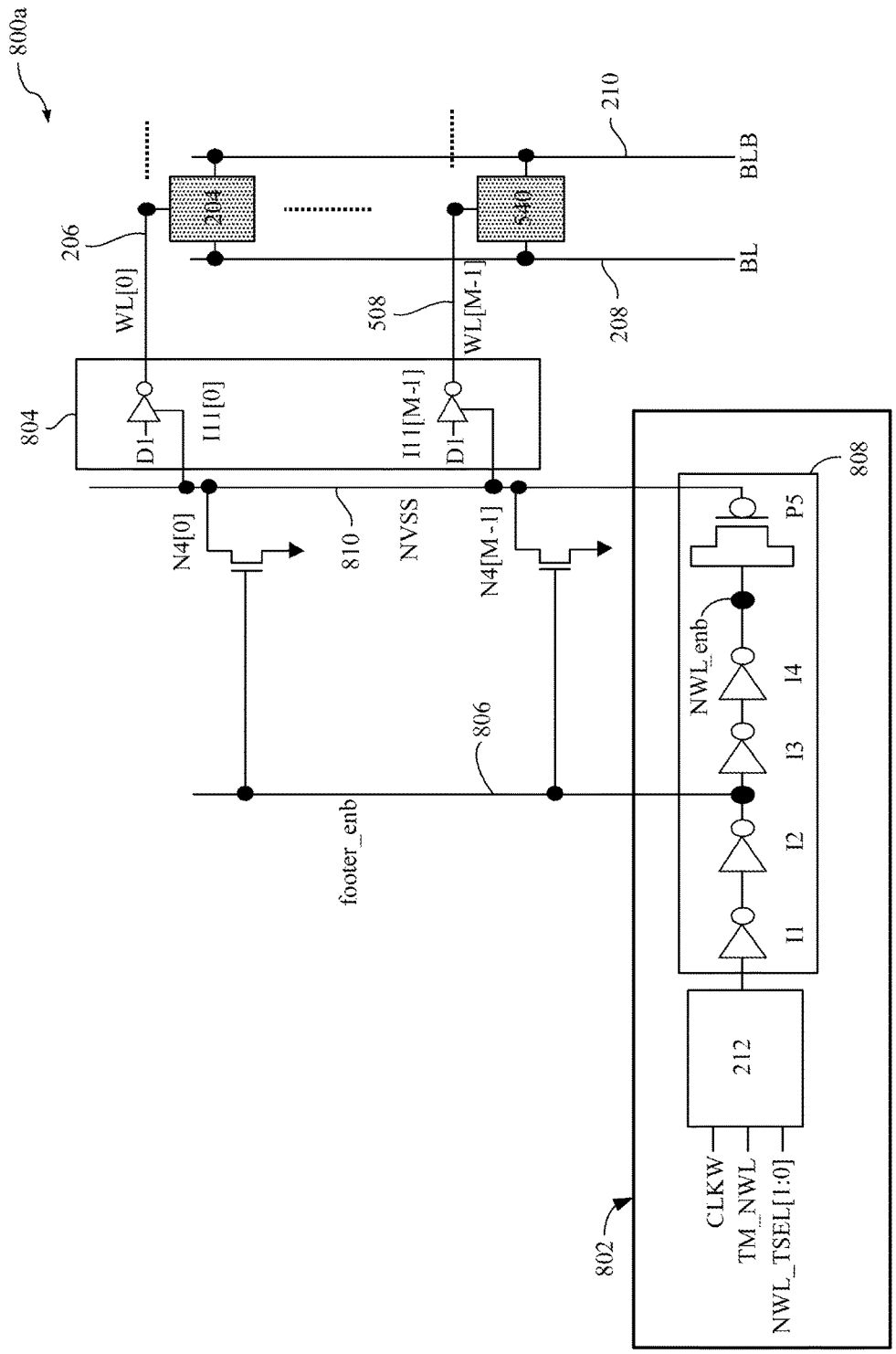
FIG. 8A is schematic diagram of a logic cell in accordance with some embodiments.

FIG. 8A is a schematic diagram of a logic cell 800a in accordance with one or more embodiments. Memory cell 204 is an embodiment of memory cell 104 and memory cell 540 is an embodiment of memory cell 140 shown in FIG. 1. Word line WL[0] 206 is an embodiment of write word line WWL[0] 102 shown in FIG. 1. Word line WL[M−1] 508 is an embodiment of write word line WWL[M−1] 138 shown in FIG. 1. Bit line BL 208 is an embodiment of write bit line WBL[0] 150 shown in FIG. 1. Bit line bar BLB 210 is an embodiment of write bit line bar WBLB[0] 152 shown in FIG. 1.

Logic cell 800a comprises memory cells 204, 540, word line control unit 802, word line driver 804, footer line 806, negative word line 810, NMOS transistors N4[0], . . . N[M−1] where M is an integer corresponding to the number of rows in memory cell array 100, word lines WL[0] 206, . . . , WL[M−1] 508 where M is an integer corresponding to the number of rows in the memory cell array, bit line BL 208 and bit line bar 210.

Memory cell 204 is connected to word line control unit 802 by word line driver 804, word line WL[0] 206, negative word line 810 and footer line 806. Memory cell 540 is connected to word line control unit 802 by word line driver 804 and word line WL[M−1] 508, negative word line 810 and footer line 806. In some embodiments, one word line control unit 802 is connected to one or more memory cells 204, 540. In some embodiments, one or more word line control units 802 are connected to at least one memory cell 204. In some embodiments, word line driver 804 is connected to each of the memory cells in memory cell array 100 by word lines WL[0] 206, . . . , WL[M−1] 508.

Word line control unit 802 is configured to receive a clock signal CLKW, a tracking control signal TM_NWL and a select control signal NWL_TSEL. Word line control unit 802 is configured to send first voltage control signal footer_enb to NMOS transistors N[0], . . . , N[M−1]. Word line control unit 802 is configured to control word line driver 804 by the negative word line signal NVSS. Word line control unit 802 comprises a timing unit 212 and a voltage control unit 808.

Timing unit 212 is configured to receive clock signal CLKW, tracking control signal TM_NWL and select control signal NWL_TSEL. The clock signal CLKW is, e.g., a logically low signal or a logically high signal. The tracking control signal TM_NWL is, e.g., a logically low signal or a logically high signal. In some embodiments, the select control signal NWL_TSEL is, e.g., a logically low signal or a logically high signal. In some embodiments, select control signal NWL_TSEL is a multiple bit signal with more than two logical states. Timing unit 212 is configured to send a control signal to voltage control unit 808. In some embodiments, the control signal sent to the voltage control unit 808 is a version of the first voltage control signal footer_enb prior to the inverters I1 and I2. The first voltage control signal footer_enb is, e.g., a logically low signal or a logically high signal. In some embodiments, timing unit 212 is configured to control the timing of the word line control unit 802. In some embodiments, timing unit 212 is configured to control the pulse width of the first voltage control signal footer_enb. In some embodiments, timing unit 212 is configured to control the rising edge or the falling edge of the first voltage control signal footer_enb. Timing unit 212 is connected to voltage control unit 808. Timing unit 212 includes three inputs; one input of timing unit 212 is connected to the source of the clock signal CLKW, one input of timing unit 212 is connected to the source of the tracking control signal TM_NWL and one input of timing unit 212 is connected to the source of the select control signal NWL_TSEL.

Voltage control unit 808 comprises inverter I1, inverter I2, inverter I3, inverter I4 and PMOS transistor P5. Voltage control unit 808 is configured to receive a signal from timing unit 212. Voltage control unit 808 is configured to send first voltage control signal footer_enb to NMOS transistors N4[0], . . . , N4[M−1]. Voltage control unit 808 is configured to control a negative word line signal NVSS. In some embodiments, the negative word line signal NVSS is a value ranging from about VSS+ΔVnvss volts to about VSS volts, where ΔVnvss is a negative voltage signal. In some embodiments, voltage VSS is substantially equal to ground. In some embodiments, the negative voltage signal ΔVnvss ranges from about −200 mV to about 0 volts. In some embodiments, a voltage control unit 808 is one or more voltage controllers. In some embodiments, a voltage controller is configured to selectively adjust the voltage of the memory cell.

Inverter I1 is connected to timing unit 212 and inverter I2. Inverter I1 is configured to receive a control signal from the timing unit 212. Inverter I1 is configured to send an inverted version of the control signal to inverter I2.

Inverter I2 is connected to inverter I1, inverter I3 and NMOS transistors N4[0], ..., N4[M−1]. Inverter I2 is configured to receive the inverted version of the control signal from inverter I1. Inverter I2 is configured to send a first voltage control signal footer_enb to inverter I3 and NMOS transistors N4[0], ..., N4[M−1]. Inverter I2 is connected to NMOS transistors N4[0], ..., N4[M−1] by footer line 806.

Inverter I3 is connected to inverter I2, inverter I4 and NMOS transistors N4[0], ..., N4[M−1]. Inverter I3 is configured to receive the first voltage control signal footer_enb from inverter I3. Inverter I3 is configured to send an inverted version of the first voltage control signal footer_enb to inverter I4.

Inverter I4 is connected to inverter I3 and PMOS transistor P5. Inverter I4 is configured to receive the inverted version of the first voltage control signal footer_enb from inverter I3. Inverter I4 is configured to send a second voltage control signal NWL_enb to PMOS transistor P5. In some embodiments, the second voltage control signal NWL_enb is a delayed version of the first voltage control signal footer_enb. The second voltage control signal NWL_enb is, e.g., a logically low signal or a logically high signal.

The drain of PMOS transistor P5 is connected to the source of PMOS transistor P5. The gate of PMOS transistor P5 is connected to the drain of NMOS transistors N[0], ..., N[M−1] and word line write driver 804. In some embodiments, PMOS transistor P5 functions as a capacitor since the drain and source terminals of the PMOS transistor P5 are coupled together. In some embodiments, PMOS transistor P5 is configured to control the negative word line signal NVSS. In some embodiments, the second voltage control signal NWL_enb controls the charging/discharging of the PMOS transistor P5.

The gate of NMOS transistors N4[0], ..., N4[M−1] are connected to inverter I2 and inverter I3 by footer line 806. The gate of NMOS transistors N4[0], ..., N4[M−1] is configured to receive the first voltage control signal footer_enb. The source of NMOS transistors N4[0], ..., N4[M−1] is connected to ground. The drain of NMOS transistors N4[0], ..., N4[M−1] is connected to the gate of PMOS transistor P5 and word line driver 804. In some embodiments, the first voltage control signal footer_enb selectively turns on/off NMOS transistors N4[0], ..., N4[M−1]. In some embodiments, NMOS transistors N4[0], ..., N4[M−1] are configured to control the negative word line signal NVSS. In some embodiments, the first voltage control signal footer_enb and the second voltage control signal NWL_enb controls the charging/discharging of the PMOS transistor P5.

Word line driver 804 comprises inverters I11[0], ..., I11[M−1] where M is an integer corresponding to the number of rows in memory cell array 100. Inverters I11[0], ..., I11[M−1] are connected to the drain of NMOS transistors N4[0], ..., N4[M−1] and the gate of PMOS transistor P5 by negative word line 810.

Inverters I11[0], ..., I11[M−1] are configured to receive a data signal D1. Inverters I11[0], ..., I11[M−1] are configured to receive the negative word line signal NVSS by negative word line 810. In some embodiments, inverters I11[0], ..., I11[M−1] are powered by negative word line signal NVSS. In some embodiments, inverters I11[0], ..., I11[M−1] are configured such that the negative word line signal NVSS is connected to the operating voltage terminal of inverters I11[0], ..., I11[M−1]. Inverters I11[0], ..., I11[M−1] are configured to send a word line signal WL on word lines WL[0] 206, ..., WL[M−1] 508 to each of the memory cells (e.g., memory cells 204, 540).

In some embodiments, the word line signal WL is a value ranging from about VSS+ΔVw1 volts to about VSS volts, where ΔVw1 is a negative voltage signal. In some embodiments, the negative voltage signal ΔVw1 ranges from about −150 mV to about 0 volts. In some embodiments, the negative voltage signal ΔVw1 is less than the negative word line signal NVSS.

Figure 8B:
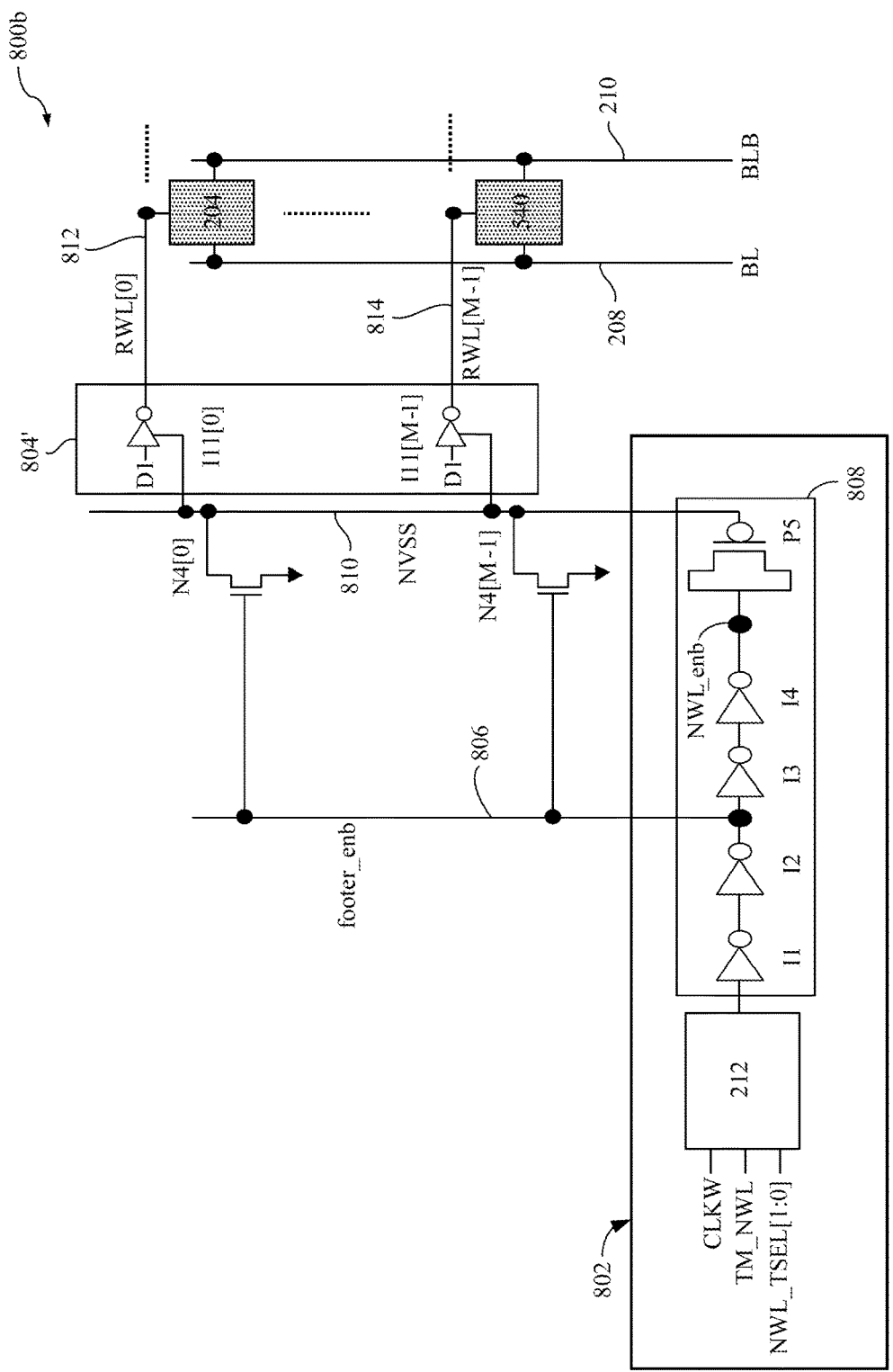
FIG. 8B is schematic diagram of a logic cell in accordance with some embodiments.

FIG. 8B is a schematic diagram of a logic cell 800b in accordance with one or more embodiments. Logic cell 800b is an embodiment of logic cell 800a with similar elements. In comparing FIGS. 8A and 8B, the word line driver 804 of FIG. 8A is replaced with the read word line driver 804' of FIG. 8B, and the word lines WL[0] 206, ..., WL[M−1] 508 of FIG. 8A are replaced with the read word lines RWL[0] 812, ..., RWL[M−1] 814 of FIG. 8B.

Read word line driver 804' is an embodiment of word line driver 804. Read word lines RWL[0] 812, ..., RWL[M−1] 814 are an embodiment of the read word lines RWL[0] 180, ..., RWL[M−1] 186 shown in FIG. 1. Read word lines RWL[0] 812, ..., RWL[M−1] 814 connect the read word line driver 804' to the memory cells 204, ..., 540.

Figure 9:
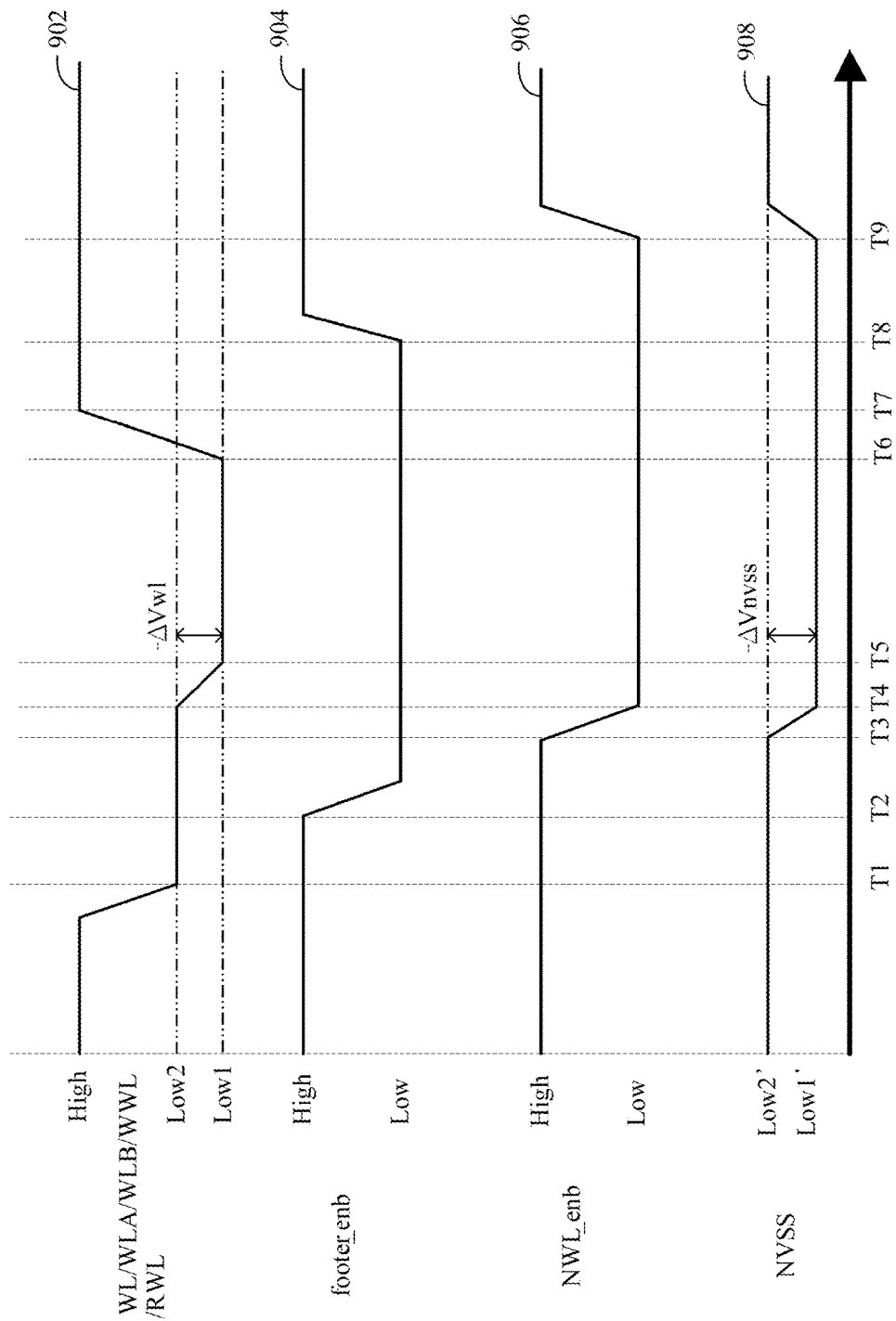
FIG. 9 is a waveform diagram of signals applied to one or more write logic cells of an SRAM in accordance with some embodiments.

FIG. 9 is a waveform diagram of signals applied to write logic cell 800a or 800b of an SRAM in accordance with one or more embodiments.

Curve 902 represents the signal on the word line WL (e.g., word line WL 316 shown in FIG. 3A, first word line A_WL 316a or second word line A_WL 328 shown in FIG. 3B, write word line WWL 316' or read word line RWL 328' shown in FIG. 3C); curve 904 represents the first voltage control signal footer_enb; curve 906 represents the second voltage control signal NWL_enb; and curve 908 represents the negative word line signal NVSS. FIG. 9 shows waveforms of various signals when memory cells 204, 540 are accessed for a read or write operation.

At time T1, curve 902 (e.g., word line signal WL or read word line signal RWL) transitions from a logically high signal to a logically low signal. In some embodiments, for a write operation, when curve 902 transitions to a logically low signal, the first pass gate 312 and the second pass gate 314 (as shown in FIG. 3A-3C) each turn-on connecting the bit line BL/bit line bar BLB to the cross-coupled inverters 302.

At time T2, curve 904 (e.g., first voltage control signal footer_enb) starts transitioning from a logically high signal to a logically low signal.

After time T2, curve 904 (e.g., first voltage control signal footer_enb) finishes transitioning from a logically high signal to a logically low signal. In some embodiments, when curve 904 transitions to a logically low signal, the NMOS transistors N4[0], ..., N4[M−1] (as shown in FIG. 8) turn-off which disconnects the gate of the PMOS transistor P5 from ground (e.g., VSS).

At time T3, curve 906 (e.g., second voltage control signal NWL_enb) transitions from a logically high signal to a logically low signal. At time T3, curve 908 (e.g., negative word line signal NVSS) transitions from a second low signal level LOW2' to a first low signal level LOW1'. In some embodiments, the second low signal level LOW2' is an intermediate signal which ranges from about the first low signal level LOW1' to about a logically high signal.

In some embodiments, the second signal level LOW2 is substantially equal to voltage VSS. In some embodiments, the first signal level LOW1 is substantially equal to VSS+ΔVw1, where ΔVw1 is a negative voltage signal. In some embodiments, the second signal level LOW2' is substantially equal to voltage VSS. In some embodiments, the first signal level LOW1' is substantially equal to VSS+ΔVnvss, where ΔVnvss is a negative voltage signal.

In some embodiments, PMOS transistor P5 functions as a capacitor since the source and drain are coupled together. In some embodiments, a change in the first voltage control signal footer_enb (e.g., curve 904) and the second voltage control signal NWL_enb (e.g., curve 906), causes the PMOS transistor P5 to discharge resulting in a change in the negative word line signal NVSS (e.g., curve 908). In some embodiments, the change in the first voltage control signal footer_enb (e.g., curve 904) directly results in a change in the second voltage control signal NWL_enb (e.g., curve 906). In some embodiments, the change in the first voltage control signal footer_enb (e.g., curve 904) or the second voltage control signal NWL_enb (e.g., curve 906), triggers a corresponding change in both the negative word line signal NVSS (e.g., curve 908) and the word line/read word line signal WL/RWL (e.g., curve 902). In some embodiments, a change in the negative word line signal NVSS (e.g., curve 908) results in a corresponding change of the word line/read word line signal WL/RWL (e.g., curve 902).

At time T4, curve 906 (e.g., second voltage control signal NWL_enb) finishes transitioning to a logically low signal. At time T4, curve 908 (e.g., boosted voltage signal BVDD) finishes transitioning to a first low signal level LOW1'. At time T4, curve 902 (e.g., word line signal WL or read word line signal RWL) transitions from a second low signal level LOW2 to a first low signal level LOW1. In some embodiments, the second low signal level LOW2 is an intermediate signal which ranges from about the first low signal level LOW1 to about a logically high signal.

At time T5, curve 902 (e.g., word line signal WL or read word line signal RWL) finishes transitioning to a first low signal level LOW1.

At time T6, curve 902 (e.g., word line signal WL or read word line signal RWL) transitions to a logically high signal. In some embodiments, for a write operation, when curve 902 transitions to a logically high signal, the first pass gate 312 and the second pass gate 314 (as shown in FIG. 3A-3C) each turn-off and disconnect the bit line BL/bit line bar BLB from the cross-coupled inverters 302. In some embodiments, a single read or write cycle of the word line is represented by curve 902.

At time T7, curve 902 (e.g., word line signal WL or read word line signal RWL) finishes transitioning to a logically high signal.

At time T8, curve 904 (e.g., first voltage control signal footer_enb) transitions from a logically low signal to a logically high signal.

At time T9, curve 906 (e.g., second voltage control signal NWL_enb) transitions to a logically high signal. At time T9, curve 908 (e.g., boosted voltage signal BVDD) transitions to a second low signal level LOW2'.

In some embodiments, curve 902 (e.g., word line signal WL or read word line signal RWL) transitions to a voltage level less than ground which strengthens the capability of first pass gate 312, the second pass gate 314, third pass gate 322, fourth pass gate 324 and read bit line transistor 324a (as shown in FIGS. 3A-3C). In some embodiments, curve 902 (e.g., word line signal WL or read word line signal RWL) transitions to a voltage level less than ground which improves the operating region (e.g., VCCmin) of memory cells 204, . . . , 540. In some embodiments, the operating region (e.g., VCCmin) of memory cells 204, . . . , 540 is the minimum voltage at which the memory cell can reliably operate.

Figure 10:
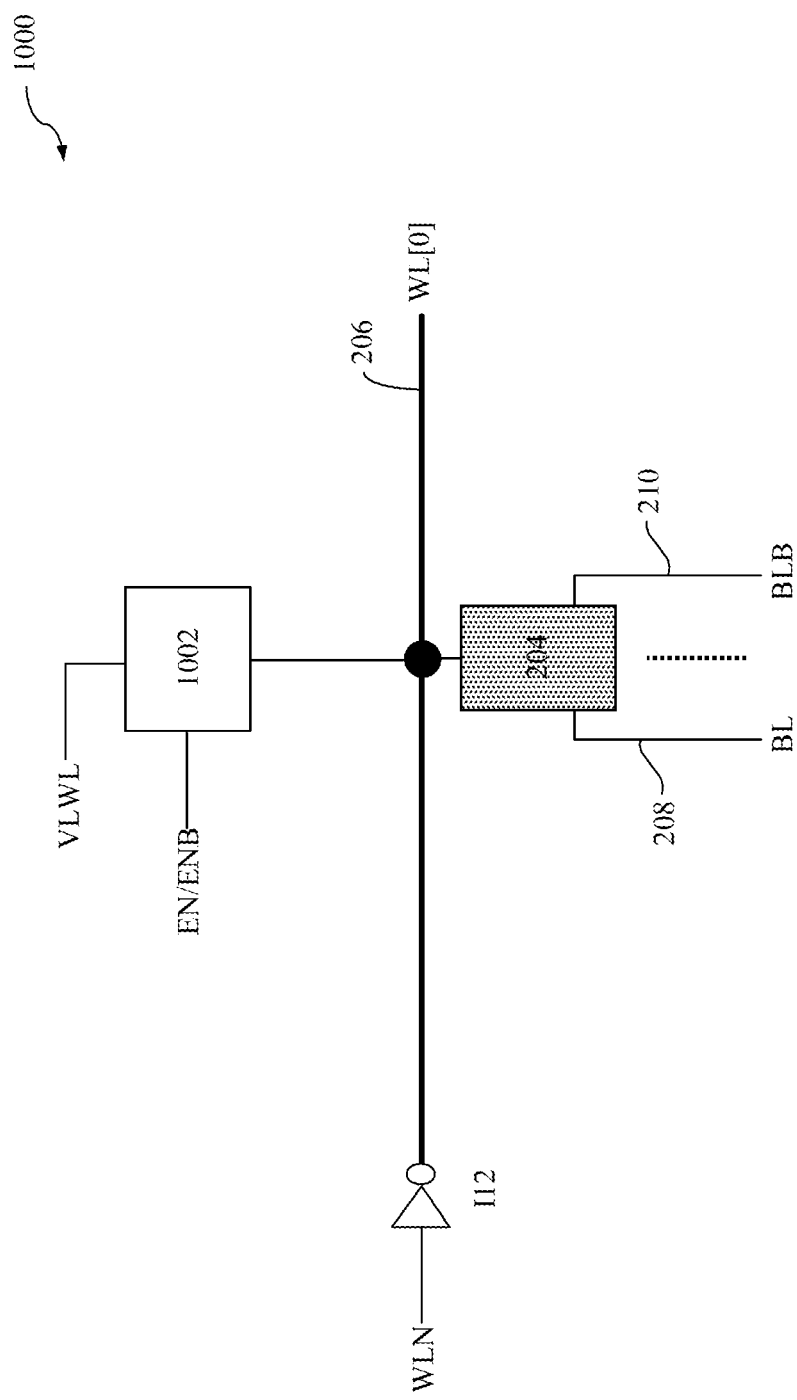
FIG. 10 is schematic diagram of a write logic cell in accordance with some embodiments.

FIG. 10 is a schematic diagram of a write logic cell 1000 in accordance with one or more embodiments. Memory cell 204 is an embodiment of memory cell 104 shown in FIG. 1. Word line WL[0] 206 is an embodiment of write word line WWL[0] 102 shown in FIG. 1. Bit line BL 208 is an embodiment of write bit line WBL[0] 150 shown in FIG. 1. Bit line bar BLB 210 is an embodiment of write bit line bar WBLB[0] 152 shown in FIG. 1.

Write logic cell 1000 comprises a voltage control unit 1002, an inverter I12, memory cell 204, word line WL[0] 206, bit line BL 208 and bit line bar BLB 210. Memory cell 204 is connected to a bit line BL 208 and a bit line bar BLB 210.

Voltage control unit 1002 is configured to receive a first signal EN/ENB. In some embodiments, first signal EN/ENB is, e.g., a logically low signal or a logically high signal. In some embodiments, first signal EN/ENB is, e.g., a pulse signal that transitions to and from a logically low signal or a logically high signal. In some embodiments, first signal EN/ENB is an enable/disable signal which switches the voltage control unit 1002 on/off. Voltage control unit 1002 is configured to receive a second signal VLWL. In some embodiments, second signal VLWL is, e.g., a logically low signal or a logically high signal. In some embodiments, second signal VLWL is a voltage signal connected to voltage source VDD. Voltage control unit 1002 is configured to control a word line signal WL on word line WL[0] 206. In some embodiments, voltage control unit 1002 is configured to change the word line signal WL on word line WL[0] 206. The voltage control unit 1002 is connected to inverter I12 and memory cell 204 by word line WL[0] 206. In some embodiments, voltage control unit 1002 is connected to one or more memory cells in memory cell array 100. In some embodiments, a plurality of voltage control units 1002 are each connected to one or more memory cells in memory cell array 100. In some embodiments, voltage control unit 1002 is one or more voltage controllers. In some embodiments, a voltage controller is configured to selectively adjust the voltage of the memory cell 204.

Inverter I12 is connected to memory cell 204 and voltage control unit 1002 by the word line WL[0] 206. Inverter I12 is configured to receive a word line signal WLN. In some embodiments, word line signal WLN is, e.g., a logically low signal or a logically high signal. Inverter I12 is configured to send word line signal WL to memory cell 204 and voltage control unit 1002. In some embodiments, word line signal WL is an inverted version of word line signal WLN.

Figures 11A, 11B, 11C:
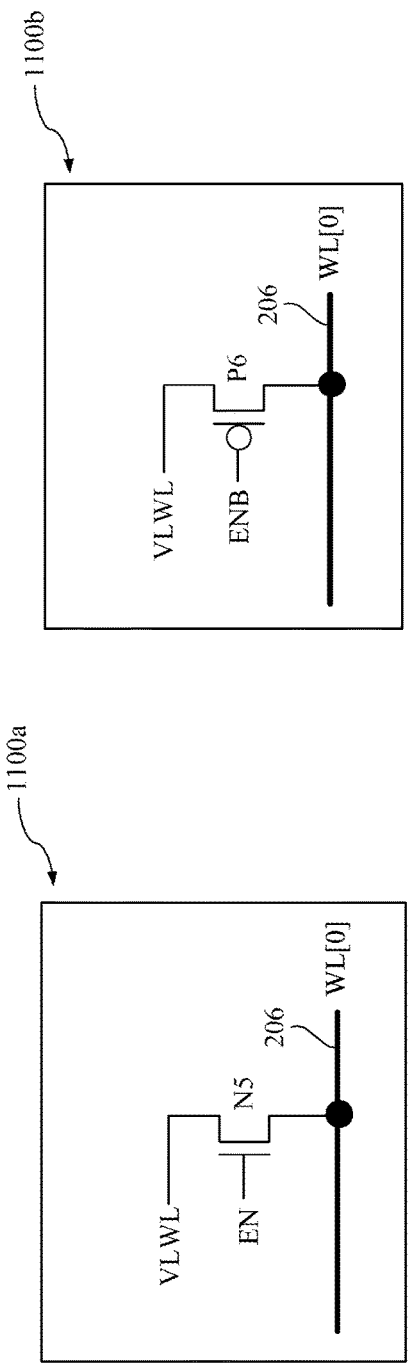
FIG. 11A is schematic diagram of a voltage control unit in accordance with some embodiments.
FIG. 11B is schematic diagram of a voltage control unit in accordance with some embodiments.
FIG. 11C is schematic diagram of a voltage control unit in accordance with some embodiments.

FIG. 11A is a schematic diagram of a voltage control unit 1100a in accordance with one or more embodiments. Voltage control unit 1100a is an embodiment of the voltage control unit 1002 shown in FIG. 10 with similar elements.

Voltage control unit 1100a is configured to receive first signal EN and second signal VLWL. Voltage control unit 1100a is configured to control a word line signal WL on word line WL[0] 206. Voltage control unit 1100a comprises an NMOS transistor N5. In some embodiments, voltage control unit 1100a is one or more voltage controllers. In some embodiments, a voltage controller is configured to selectively adjust the voltage of the memory cell.

The gate of NMOS transistor N5 is connected to the source of first signal EN. In some embodiments, first signal EN is an enable/disable signal which switches the NMOS transistor N5 on/off. The drain of NMOS transistor N5 is connected to the source of second signal VLWL. In some embodiments, the second signal VLWL is a voltage received from a voltage source VDD. The source of NMOS transistor N5 is connected to word line WL[0] 206. NMOS transistor N5 is configured to control word line signal WL on word line WL[0] 206. In some embodiments, NMOS transistor N5 is configured to change the word line signal WL on word line WL[0] 206.

FIG. 11B is a schematic diagram of a voltage control unit 1100b in accordance with one or more embodiments. Voltage control unit 1100b is an embodiment of the voltage control unit 1002 shown in FIG. 10 with similar elements.

Voltage control unit 1100b is configured to receive inverted first signal ENB and second signal VLWL. Voltage control unit 1100b is configured to control a word line signal WL on word line WL[0] 206. Voltage control unit 1100b comprises a PMOS transistor P6. In some embodiments, voltage control unit 1100b is one or more voltage controllers. In some embodiments, a voltage controller is configured to selectively adjust the voltage of the memory cell.

The gate of PMOS transistor P6 is connected to the source of inverted first signal ENB. In some embodiments, inverted first signal ENB is an enable/disable signal which switches the PMOS transistor P6 on/off. The source of PMOS transistor P6 is connected to the source of second signal VLWL. In some embodiments, the second signal VLWL is a voltage received from a voltage source VDD. The drain of PMOS transistor P6 is connected to word line WL[0] 206. PMOS transistor P6 is configured to control word line signal WL on word line WL[0] 206. In some embodiments, PMOS transistor P6 is configured to change the word line signal WL on word line WL[0] 206.

FIG. 11C is a schematic diagram of a voltage control unit 1100c in accordance with one or more embodiments. Voltage control unit 1100c is an embodiment of the voltage control unit 1002 shown in FIG. 10 with similar elements.

Voltage control unit 1100c is configured to receive inverted first signal ENB. Voltage control unit 1100c is connected to voltage source VDD. Voltage control unit 1100c is configured to control a word line signal WL on word line WL[0] 206. Voltage control unit 1100c comprises PMOS transistor P6 and PMOS transistor P7. In some embodiments, a voltage control unit 1100c is one or more voltage controllers. In some embodiments, a voltage controller is configured to selectively adjust the voltage of the memory cell.

The gate of PMOS transistor P6 is connected to the source of inverted first signal ENB. In some embodiments, inverted first signal ENB is an enable/disable signal which switches the PMOS transistor P6 on/off. The source of PMOS transistor P6 is connected to the drain and gate of PMOS transistor P7. The drain of PMOS transistor P6 is connected to word line WL[0] 206. PMOS transistor P6 is configured to control word line signal WL on word line WL[0] 206. In some embodiments, PMOS transistor P6 is configured to change the word line signal WL on word line WL[0] 206.

The gate of PMOS transistor P7 is connected to the drain of PMOS transistor P7 and the source of PMOS transistor P6. PMOS transistor P7 is connected in a diode configuration such that the gate of PMOS transistor P7 is connected to the drain of PMOS transistor P7. The source of PMOS transistor P7 is connected to voltage source VDD.

Figure 12A:
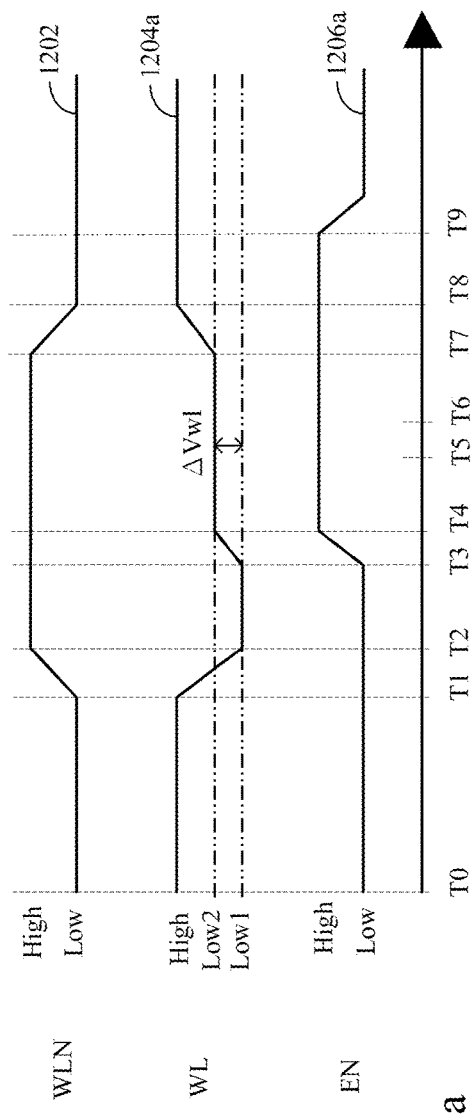
FIG. 12A is a waveform diagram of signals applied to a write logic cell of an SRAM for a write operation in accordance with some embodiments.
Figure 12B:
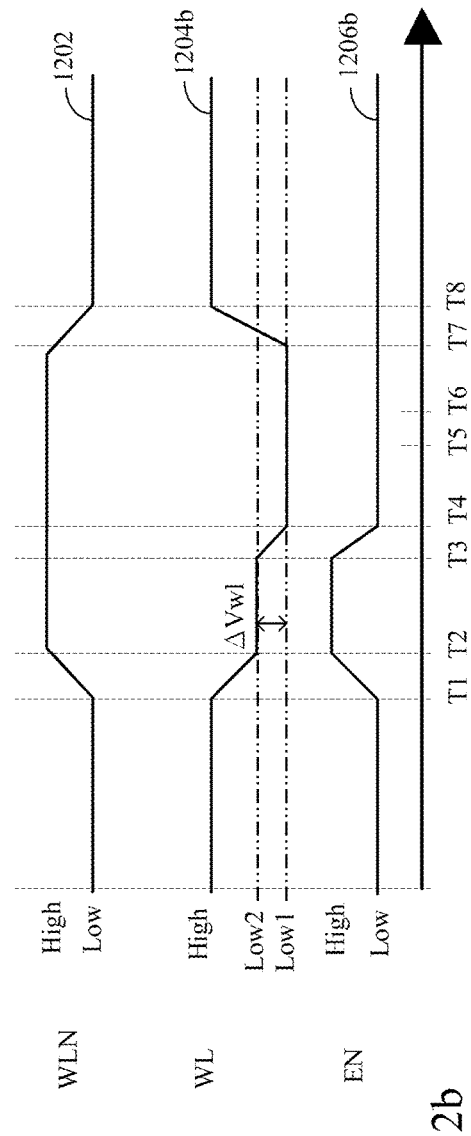
FIG. 12B is a waveform diagram of signals applied to a write logic cell of an SRAM for a write operation in accordance with some embodiments.
Figure 12C:
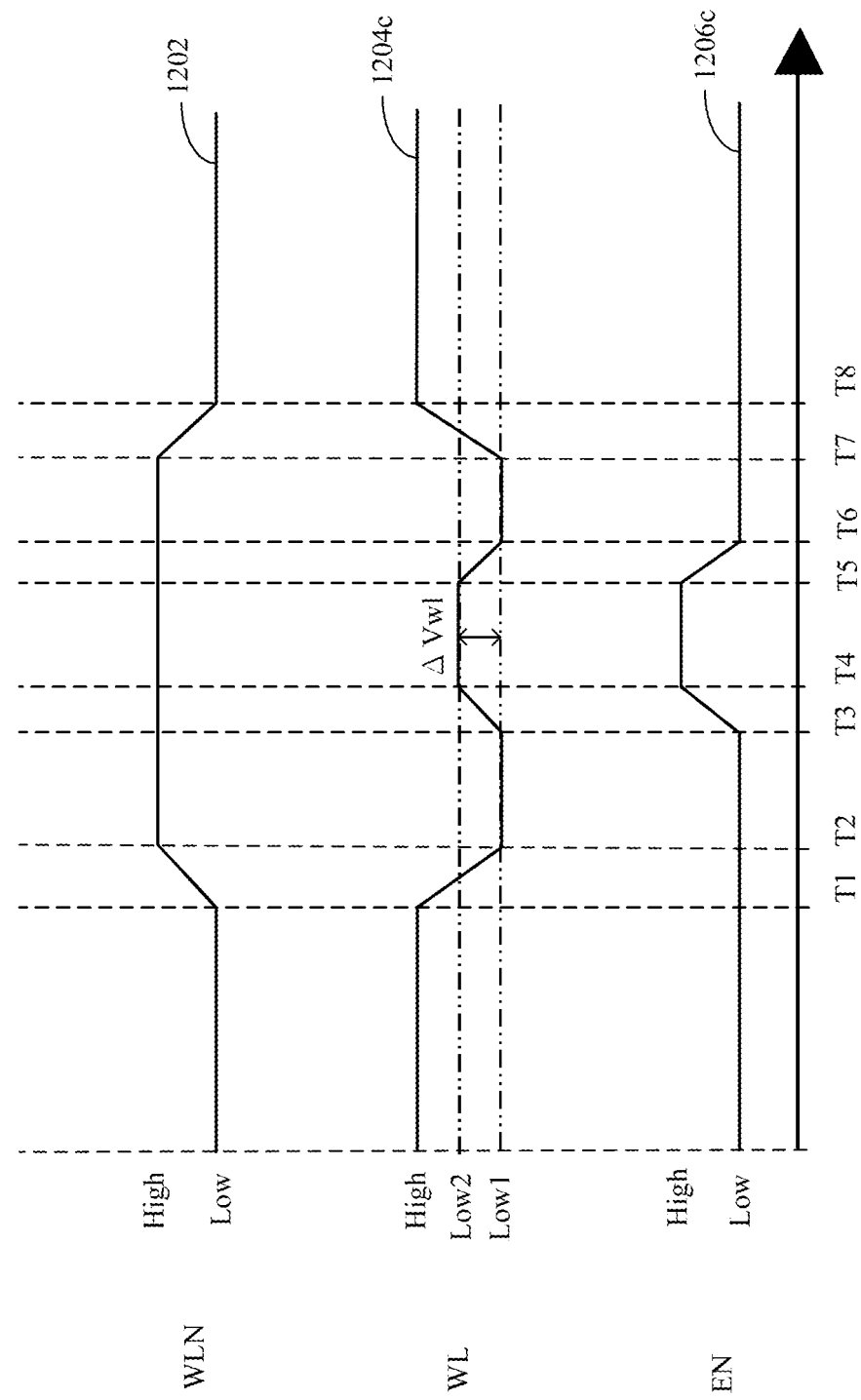
FIG. 12C is a waveform diagram of signals applied to a write logic cell of an SRAM for a write operation in accordance with some embodiments.

FIGS. 12A, 12B and 12C are waveform diagrams of signals applied to write logic cell 1000 of an SRAM for a write operation in accordance with one or more embodiments. Curve 1202 represents the inverted word line signal WLN (shown in FIG. 10); curves 1204a, 1204b, 1204c represent the word line signal WL; and curves 1206a, 1206b, 1206c represent the first signal EN.

FIG. 12A is a waveform diagram of signals applied to write logic cell 1000 of an SRAM for a write operation in accordance with one or more embodiments.

At time T1, curve 1202 (e.g., inverted word line signal WLN) transitions from a logically low signal to a logically high signal. At time T1, curve 1204a (e.g., word line signal WL) transitions from a logically high signal to a first low signal level LOW1. In some embodiments, the first low signal level LOW1 is substantially equal to voltage VSS. In some embodiments, voltage VSS is substantially equal to ground. In some embodiments, when curve 1204a transitions to a first low signal level LOW1, the first pass gate 312 and the second pass gate 314 (as shown in FIGS. 3A-3C) each turn-on connecting the bit line BL/bit line bar BLB to the cross-coupled inverters 302.

At time T2, curve 1202 (e.g., inverted word line signal WLN) finishes transitioning to a logically high signal. At time T2, curve 1204a (e.g., word line signal WL) finishes transitioning to a first low signal level LOW1.

At time T3, curve 1206a (e.g., first signal EN) transitions from a logically low signal to a logically high signal. In some embodiments, when first signal EN transitions to a logically high signal, voltage control unit 1000 switches on (e.g. NMOS transistor N5 shown in FIG. 11A or PMOS transistor P6 shown in FIGS. 11B and 11C) which boosts or lifts the word line signal WL by ΔVw1 volts. At time T3, curve 1204a (e.g., word line signal WL) transitions from a first low signal level LOW1 to a second low signal level LOW2. In some embodiments, the second low signal level LOW2 is substantially equal to VSS+ΔVw1, where ΔVw1 is the lifted voltage level. In some embodiments, the second low signal level LOW2 is an intermediate voltage level which ranges from about the first low signal level LOW1 to about a logically high signal. In some embodiments, the lifted voltage level ΔVw1 ranges from about 0 volts to about 150 mV. In some embodiments, a change in the first signal EN (e.g., curve 1206a) or curve 1202 (e.g. inverted word line signal WLN) results in a change in curve 1204a (e.g., word line signal WL).

At time T4, curve 1206a (e.g., word line signal WL) finishes transitioning to a logically high signal. At time T4, curve 1204a (e.g., word line signal WL) finishes transitioning to a second low signal level LOW2. In some embodiments, by changing the word line signal WL to second low signal level LOW2, the first pass gate 312 and the second pass gate 314 (as shown in FIGS. 3A-3C) are weakened which reduces noise from the bit line BL and bit line bar BLB.

At time T7, curve 1202 (e.g., inverted word line signal WLN) transitions from a logically high signal to a logically low signal. At time T7, curve 1204a (e.g., word line signal WL) transitions from a second low signal level LOW2 to a logically high signal.

At time T8, curve 1202 (e.g., inverted word line signal WLN) finishes transitioning to a logically low signal. At time T8, curve 1204a (e.g., word line signal WL) finishes transitioning to a logically high signal.

At time T9, curve 1206 (e.g., first signal EN) transitions to a logically low signal.

FIG. 12B is a waveform diagram of signals applied to write logic cell 1000 of an SRAM for a write operation in accordance with one or more embodiments.

At time T1, curve 1202 (e.g., inverted word line signal WLN) transitions from a logically low signal to a logically high signal. At time T1, curve 1204b (e.g., word line signal WL) transitions from a logically high signal to a second low signal level LOW2. At time T1, curve 1206b (e.g., first signal EN) transitions from a logically low signal to a logically high signal. In some embodiments, when curve 1206b (e.g., first signal EN) transitions to a logically high signal, voltage control unit 1000 switches on (e.g. NMOS transistor N5 shown in FIG. 11A or PMOS transistor P6 shown in FIGS. 11B and 11C) which boosts or lifts the word line signal WL by ΔVw1 volts, and voltage control unit 1000 adjusts curve 1204b (e.g., the word line signal WL) from reaching the first low signal level LOW1. In this example, curve 1204b (e.g., the word line signal WL) reaches second low signal level LOW2. In some embodiments, when curve 1204b reaches a second low signal level LOW2, the first pass gate 312 and the second pass gate 314 (as shown in FIGS. 3A-3C) each partially turn-on and partially connect the bit line BL/bit line bar BLB to the cross-coupled inverters 302. In some embodiments, a change in curve 1206b (e.g., first signal EN) or curve 1202 (e.g., inverted word line signal WLN) results in a change in curve 1204b (e.g., word line signal WL).

At time T2, curve 1202 (e.g., inverted word line signal WLN) finishes transitioning to a logically high signal. At time T2, curve 1204b (e.g., word line signal WL) finishes transitioning to a second low signal level LOW2. At time T2, curve 1206b (e.g., first signal EN) finishes transitioning to a logically high signal.

At time T3, curve 1206b (e.g., first signal EN) transitions from a logically high signal to a logically low signal. At time T3, curve 1204b (e.g., word line signal WL) transitions from a second low signal level LOW2 to a first low signal level LOW1. In some embodiments, when curve 1206b (e.g., first signal EN) transitions to a logically low signal, voltage control unit 1000 switches off (e.g., NMOS transistor N5 shown in FIG. 11A or PMOS transistor P6 shown in FIGS. 11B and 11C) which allows the word line signal WL to reach the first low signal level LOW1.

At time T4, curve 1206b (e.g., first signal EN) finishes transitioning to a logically low signal. At time T4, curve 1204b (e.g., word line signal WL) finishes transitioning to a first low signal level LOW1.

At time T7, curve 1202 (e.g., inverted word line signal WLN) transitions from a logically high signal to a logically low signal. At time T7, curve 1204b (e.g., word line signal WL) transitions from a first low signal level LOW1 to a logically high signal.

At time T8, curve 1202 (e.g., inverted word line signal WLN) finishes transitioning to a logically low signal. At time T8, curve 1204b (e.g., word line signal WL) finishes transitioning to a logically high signal.

FIG. 12C is a waveform diagram of signals applied to write logic cell 1000 of an SRAM for a write operation in accordance with one or more embodiments.

At time T1, curve 1202 (e.g., inverted word line signal WLN) transitions from a logically low signal to a logically high signal. At time T1, curve 1204c (e.g., word line signal WL) transitions from a logically high signal to a first low signal level LOW1. In some embodiments, when curve 1204c transitions to a first low signal level LOW1, the first pass gate 312 and the second pass gate 314 (as shown in FIGS. 3A-3C) each turn-on connecting the bit line BL/bit line bar BLB to the cross-coupled inverters 302.

At time T2, curve 1202 (e.g., inverted word line signal WLN) finishes transitioning to a logically high signal. At time T2, curve 1204c (e.g., word line signal WL) finishes transitioning to a first low signal level LOW1.

At time T3, curve 1206c (e.g., first signal EN) transitions from a logically low signal to a logically high signal. In some embodiments, when curve 1206c (e.g., first signal EN) transitions to a logically high signal, voltage control unit 1000 switches on (e.g. NMOS transistor N5 shown in FIG. 11A or PMOS transistor P6 shown in FIGS. 11B and 11C) which boosts or lifts the word line signal WL by ΔVw1 volts. At time T3, curve 1204c (e.g., word line signal WL) transitions from a first low signal level LOW1 to a second low signal level LOW2. In some embodiments, when curve 1204c reaches a second low signal level LOW2, the first pass gate 312 and the second pass gate 314 (as shown in FIGS. 3A-3C) are partially turned-on and partially connected to the bit line BL/bit line bar BLB to the cross-coupled inverters 302. In some embodiments, a change in curve 1206c (e.g., first signal EN) or curve 1202 (e.g., inverted word line signal WLN) results in a change in curve 1204c (e.g., word line signal WL).

At time T4, curve 1204c (e.g., word line signal WL) finishes transitioning to a second low signal level LOW2. At time T4, curve 1206c (e.g., first signal EN) finishes transitioning to a logically high signal.

At time T5, curve 1206c (e.g., first signal EN) transitions from a logically high signal to a logically low signal. At time T5, curve 1204c (e.g., word line signal WL) transitions from a second low signal level LOW2 to a first low signal level LOW1. In some embodiments, when curve 1206c (e.g., first signal EN) transitions to a logically low signal, voltage control unit 1000 switches off (e.g., NMOS transistor N5 shown in FIG. 11A or PMOS transistor P6 shown in FIGS. 11B and 11C) which allows the word line signal WL to reach the first low signal level LOW1.

At time T6, curve 1206c (e.g., first signal EN) finishes transitioning to a logically low signal. At time T6, curve 1204c (e.g., word line signal WL) finishes transitioning to a first low signal level LOW1.

At time T7, curve 1202 (e.g., inverted word line signal WLN) transitions from a logically high signal to a logically low signal. At time T7, curve 1204c (e.g., word line signal WL) transitions from a first low signal level LOW1 to a logically high signal.

At time T8, curve 1202 (e.g., inverted word line signal WLN) finishes transitioning to a logically low signal. At time T8, curve 1204c (e.g., word line signal WL) finishes transitioning to a logically high signal.

As shown in FIGS. 12A, 12B and 12C, by controlling the timing of the rising edge or the falling edge of the signal EN, the value of the word line signal WL is similarly controlled. As shown in FIGS. 12A, 12B and 12C, by controlling the pulse width of signal EN, the length of time the word line signal WL is raised or lifted up to the second low signal LOW2 is controlled. As shown in FIG. 12A, the word line WL[0] turn on slew rate is improved when compared with memory cells embodiments not utilizing the voltage control unit 1000. As shown in FIG. 12B, by delaying the word line WL[0] transition to a logically low level, noise disturbances are reduced from read currents. As shown in FIG. 12C, by combining the features of FIGS. 12A and 12B, the word line WL[0] turn on slew rate is improved and noise disturbances are reduced from read currents.

Figure 13B:
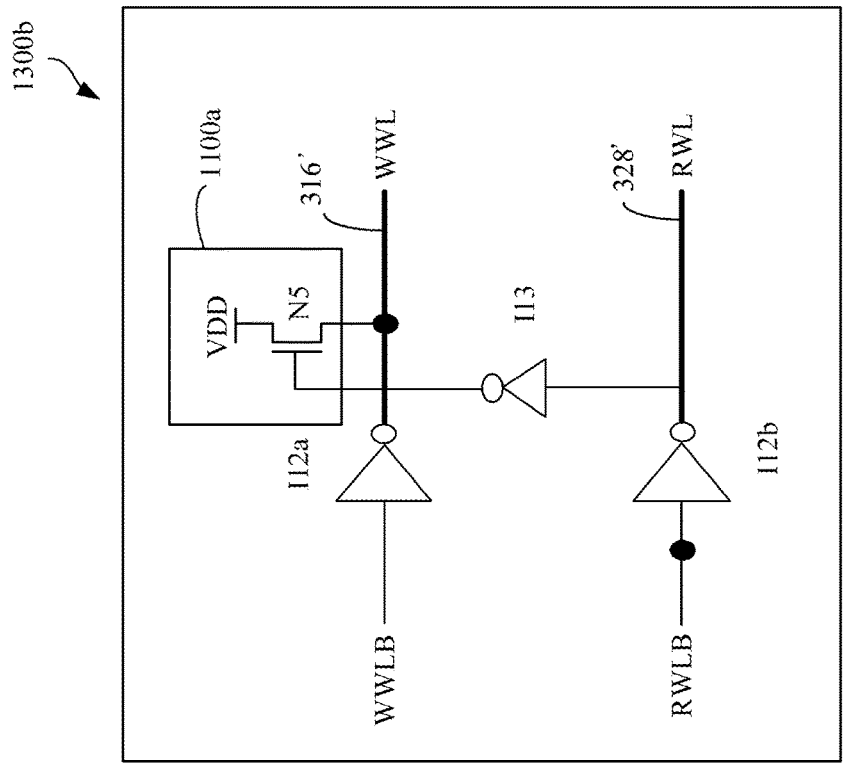
FIG. 13B is schematic diagram of a read logic cell in accordance with some embodiments.
Figure 13A:
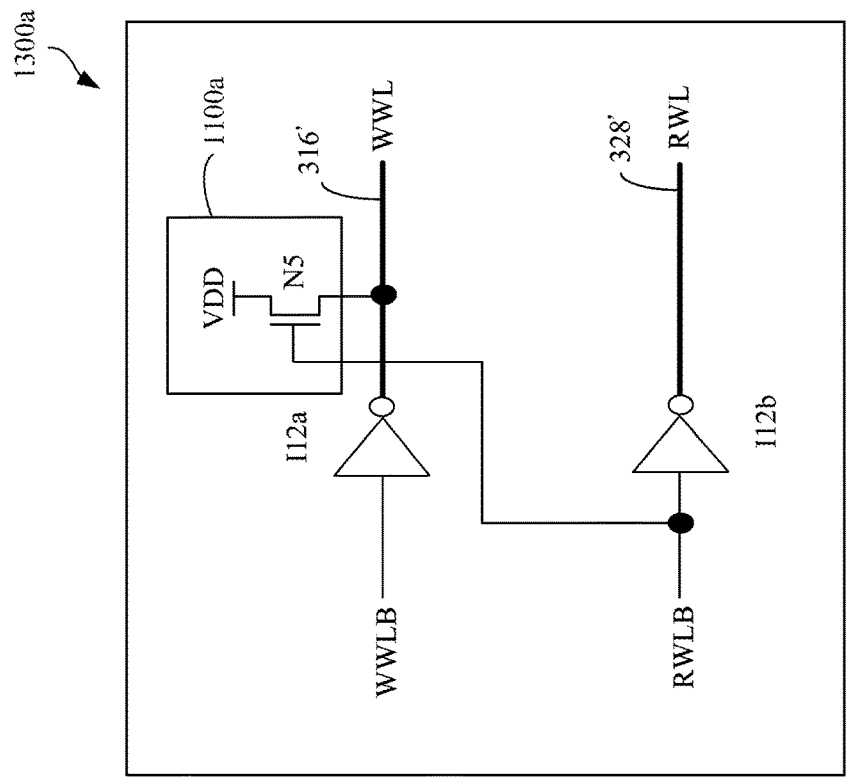
FIG. 13A is schematic diagram of a read logic cell in accordance with some embodiments.

FIG. 13A is a schematic diagram of a read logic cell 1300a in accordance with one or more embodiments. Read logic cell 1300a is an embodiment of the write logic cell 1000 shown in FIG. 10 with similar elements. In comparing FIGS. 10 and 13A, the word line WL[0] 206 of FIG. 10 is replaced with the write word line WWL 316'.

Voltage control unit 1100a is an embodiment of voltage control unit 1002 shown in FIG. 11A. In this example, read word line signal RWLB is an embodiment of first signal EN shown in FIG. 11A. Write word line WWL 316' is an embodiment of word line 316 shown in FIG. 3a. Read word line RWL 328' is an embodiment of read word line 328 shown in FIG. 3a. Inverter I12a is an embodiment of inverter I12 shown in FIG. 10.

Write logic cell 1300a comprises a voltage control unit 1100a, inverter I12a, inverter I12b, memory cell 204, write word line WWL 316' and read word line RWL 328'. For simplicity, memory cell 204 is not shown in FIG. 13A.

Voltage control unit 1100a is configured to receive a first signal RWLB by the gate of NMOS transistor N5. In some embodiments, first signal RWLB is, e.g., a logically low signal or a logically high signal. In some embodiments, first signal RWLB is, e.g., a pulse signal that transitions to and from a logically low signal or a logically high signal. In some embodiments, first signal RWLB is an enable/disable signal which switches the voltage control unit 1100a on/off. Voltage control unit 1100a is connected to voltage source VDD by the drain of NMOS transistor N5. Voltage control unit 1100a is connected to write word line WWL 316' by the source of NMOS transistor N5. Voltage control unit 1100a is configured to control a write word line signal WWL on write word line WL 316' in response to signals received from the first signal RWLB. In some embodiments, voltage control unit 1100a is configured to change the write word line signal WWL on write word line WWL 316'. The voltage control unit 1100a is connected to inverter I12a, inverter I12b, write word line WWL 316', read word line RWL 328' and memory cell 204 (not shown). In some embodiments, voltage control unit 1100a is connected to one or more memory cells in memory cell array 100. In some embodiments, a plurality of voltage control units 1100a are each connected to one or more memory cells in memory cell array 100.

Inverter I12a is connected to memory cell 204 (not shown) and voltage control unit 1100a. Inverter I12a is configured to receive a write word line signal WWLB. In some embodiments, write word line signal WWLB is, e.g., a logically low signal or a logically high signal. Inverter I12a is configured to send write word line signal WWL to memory cell 204 (no shown) and voltage control unit 1100a. In some embodiments, write word line signal WWL is an inverted version of write word line signal WWLB.

Inverter I12b is connected to memory cell 204 (not shown) and voltage control unit 1100a by the read word line RWL 328'. Inverter I12b is configured to receive a read word line signal RWLB. In some embodiments, read word line signal RWLB is, e.g., a logically low signal or a logically high signal. Inverter I12b is configured to send read word line signal RWL to memory cell 204 (not shown). In some embodiments, read word line signal RWLB is an inverted version of read word line signal RWL.

The read word line signal RWLB controls the voltage control unit 1100a by switching on/off the gate of NMOS transistor N5. In some embodiments, switching on/off the gate of NMOS transistor N5 results in a change of the write word line signal WWL on write word line WL 316'.

FIG. 13B is a schematic diagram of a read logic cell 1300b in accordance with one or more embodiments. Read logic cell 1300b is an embodiment of the read logic cell 1300a shown in FIG. 13A with similar elements. Read logic cell 1300b includes each of the elements of read logic cell 1300a, but read logic cell 1300b also comprises an inverter I13. For simplicity, memory cell 204 is not shown in FIG. 13B.

Inverter I12b is connected to memory cell 204 (not shown) and inverter I13. Inverter I12b is configured to receive a read word line signal RWLB. Inverter I12b is configured to send read word line signal RWL to inverter I13. Inverter I12b is configured to send read word line signal RWL to memory cell 204 (not shown). In some embodiments, read word line signal RWLB is an inverted version of read word line signal RWL.

Inverter I13 is connected to memory cell 204 (not shown), inverter I12a, inverter I12b and voltage control unit 1100a. Inverter I13 is configured to receive a read word line signal RWL. In some embodiments, read word line signal RWL is, e.g., a logically low signal or a logically high signal. Inverter I13 is configured to send a delayed version of read word line signal RWLB to voltage control unit 1100a.

The delayed version of the read word line signal RWLB controls the voltage control unit 1100a by switching on/off the gate of NMOS transistor N5. In some embodiments, switching on/off the gate of NMOS transistor N5 results in a change of the write word line signal WWL on write word line WL 316'.

Figure 14A:
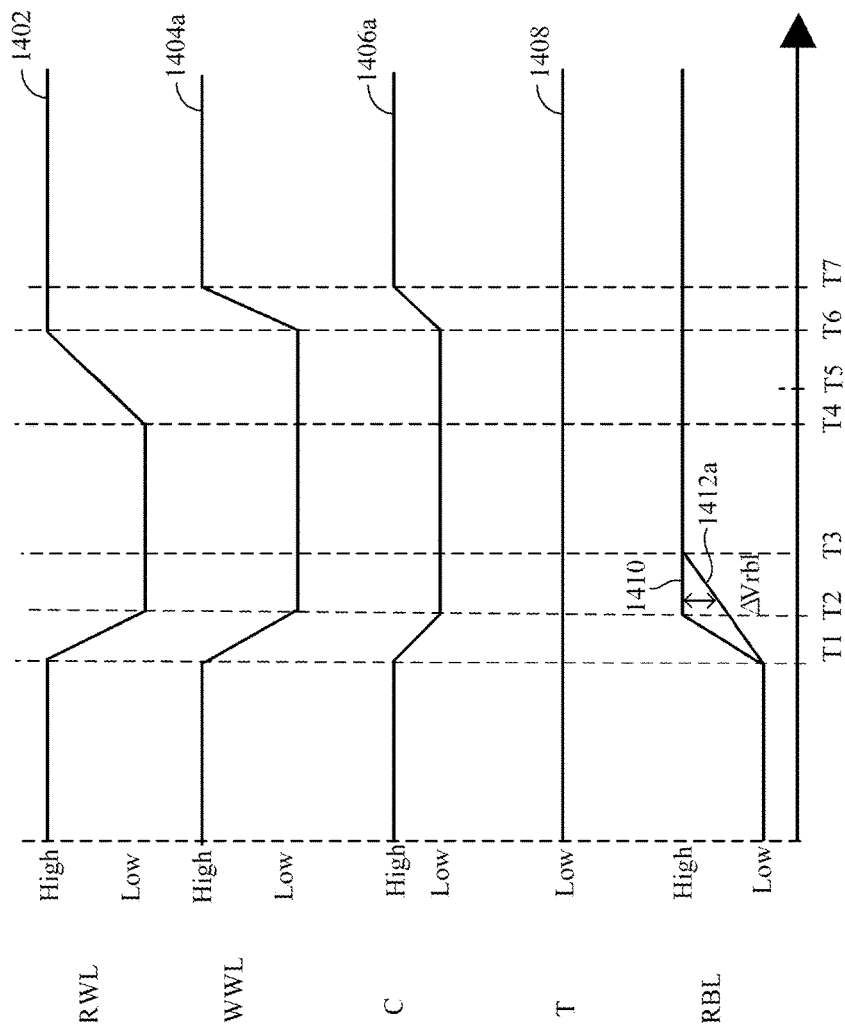
FIG. 14A is a waveform diagram of signals applied to a read logic cell of an SRAM when the voltage control unit is not operational in accordance with some embodiments.
Figure 14B:
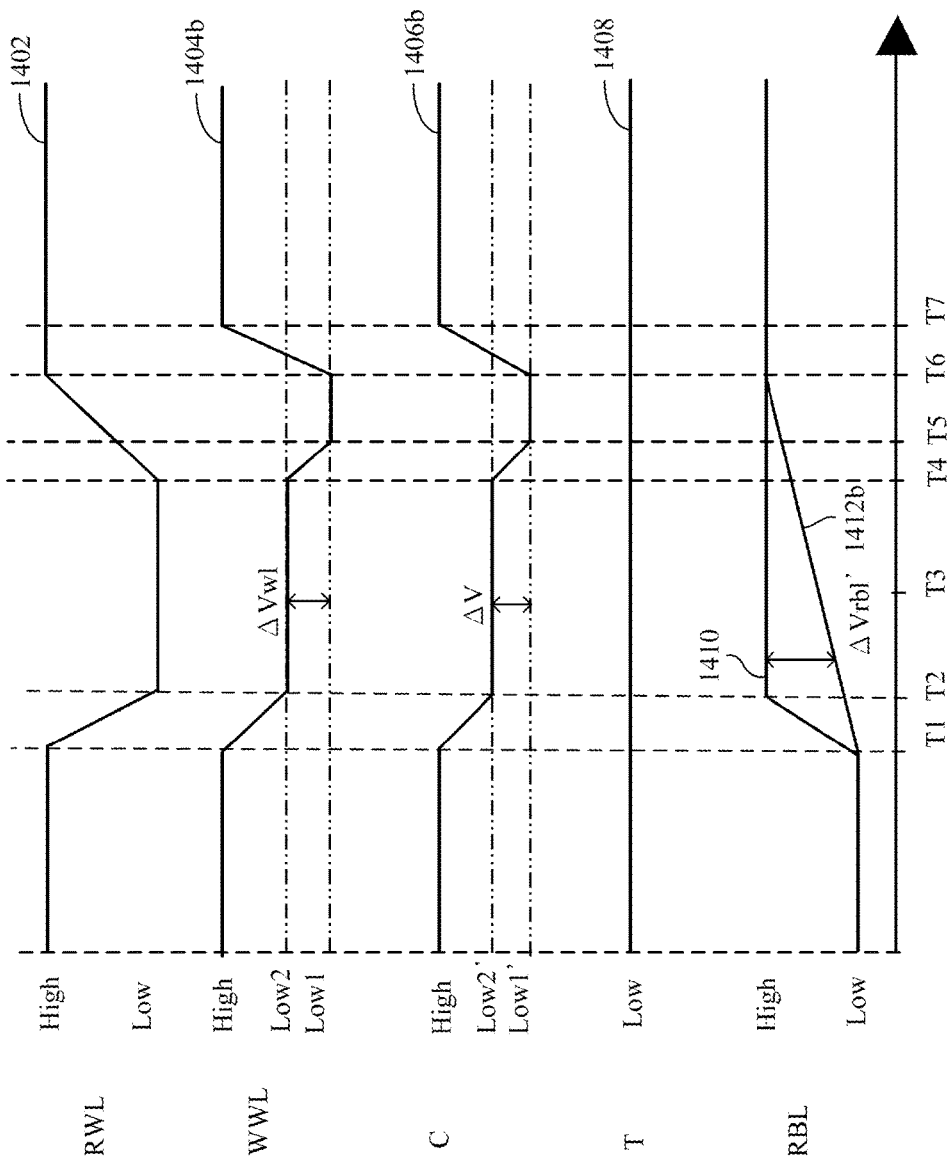
FIG. 14B is a waveform diagram of signals applied to a read logic cell of an SRAM in accordance with one or more embodiments.

FIG. 14A is a waveform diagram of signals applied to read logic cells 1300a and 1300b of an SRAM when the voltage control unit 1100a is not operational in accordance with one or more embodiments. FIG. 14B is a waveform diagram of signals applied to read logic cells 1300a and 1300b of an SRAM in accordance with one or more embodiments. Curve 1402 represents the read word line signal RWL (shown in FIGS. 13A and 13B); curves 1404a, 1404b represent the write word line signal WWL; curves 1406a, 1406b represent the signal on data node C of cross-coupled inverters 302; curve 1408 represents the signal on data node T of cross-coupled inverters 302; and curve 1410 represent the read bit line RBL (shown in FIGS. 1 and 3C) when reading a "1"; and curves 1412a, 1412b represent the read bit line RBL (shown in FIGS. 1 and 3C) when reading a "0".

FIG. 14A is a waveform diagram of signals applied to read logic cells 1300a and 1300b of an SRAM when the voltage control unit 1100a is not operational in accordance with one or more embodiments. In some embodiments, the voltage control unit 1100a is not operational if the gate of NMOS transistor N5 (shown in FIGS. 13A and 13B) is disconnected from the read word line RWLB or RWL.

At time T1, curve 1402 (e.g., read word line signal RWL) transitions from a logically high signal to a logically low signal. At time T1, curve 1404a (e.g., write word line signal WWL) transitions from a logically high signal to a logically low signal. At time T1, curve 1406a (e.g., signal at node C of cross-coupled inverters 302) transitions from a logically high signal to a logically low signal. At time T1, curve 1410 (e.g., read bit line signal RBL is a "1") transitions from a logically low signal to a logically high signal. At time T1, curve 1412a (e.g., read bit line signal RBL is a "0") transitions from a logically low signal to a logically high signal.

At time T2, curve 1402 (e.g., read word line signal RWL) finishes transitioning to a logically low signal. At time T2, curve 1404*a* (e.g., write word line signal WWL) finishes transitioning to a logically low signal. At time T2, curve 1406*a* (e.g., signal at node C of cross-coupled inverters 302) finishes transitioning to a logically low signal. At time T2, curve 1410 (e.g., read bit line signal RBL is a "1") finishes transitioning to a logically low signal.

At time T3, curve 1412*a* (e.g., read bit line signal RBL is a "0") finishes transitioning to a logically low signal. In some embodiments, from time T2 through T3, a voltage difference ΔVrb1 is observed between curve 1410 and curve 1412*a*. In some embodiments, the voltage difference ΔVrb1 represents a voltage level difference associated with observing a logical "0" and a logical "1" in memory cell 204.

At time T4, curve 1402 (e.g., read word line signal RWL) transitions from a logically low signal to a logically high signal.

At time T6, curve 1402 (e.g., read word line signal RWL) finishes transitioning to a logically high signal. At time T6, curve 1404*a* (e.g., write word line signal WWL) transitions from a logically low signal to a logically high signal. At time T6, curve 1406*a* (e.g., signal at node C of cross-coupled inverters 302) transitions from a logically low signal to a logically high signal.

At time T7, curve 1404*a* (e.g., write word line signal WWL) finishes transitioning to a logically high signal. At time T7, curve 1406*a* (e.g., signal at node C of cross-coupled inverters 302) finishes transitioning to a logically high signal.

FIG. 14B is a waveform diagram of signals applied to read logic cells 1300*a* and 1300*b* of an SRAM in accordance with one or more embodiments.

At time T1, curve 1402 (e.g., read word line signal RWL) transitions from a logically high signal to a logically low signal. At time T1, curve 1404*b* (e.g., write word line signal WWL) transitions from a logically high signal to a second low signal level LOW2. At time T1, curve 1406*b* (e.g., signal at node C of cross-coupled inverters 302) transitions from a logically high signal to a second low signal level LOW2'. At time T1, curve 1410 (e.g., read bit line signal RBL is a "1") transitions from a logically low signal to a logically high signal. At time T1, curve 1412*b* (e.g., read bit line signal RBL is a "0") transitions from a logically low signal to a logically high signal. In some embodiments, when read word line signal RWL transitions to a logically low signal, inverted read word line signal RWLB transitions to a logically high signal, and voltage control unit 1100*a* switches on (e.g. NMOS transistor N5 shown in FIGS. 13A and 13B) which boosts or lifts the write word line signal WWL by ΔVw1 volts.

At time T2, curve 1402 (e.g., read word line signal RWL) finishes transitioning to a logically low signal. At time T2, curve 1404*b* (e.g., write word line signal WWL) finishes transitioning to second low signal level LOW2. At time T2, curve 1406*b* (e.g., signal at node C of cross-coupled inverters 302) finishes transitioning to second low signal level LOW2'. At time T2, curve 1410 (e.g., read bit line signal RBL is a "1") finishes transitioning to a logically low signal.

At time T4, curve 1402 (e.g., read word line signal RWL) transitions from a logically low signal to a logically high signal. At time T4, curve 1404*b* (e.g., write word line signal WWL) transitions from a second low signal level LOW2 to a first low signal level LOW1. At time T4, curve 1406*b* (e.g., signal at node C of cross-coupled inverters 302) transitions from second low signal level LOW2' to a first low signal level LOW1'. In some embodiments, the second low signal level LOW2 is an intermediate voltage level which ranges from about the first low signal level LOW1 to about a logically high signal. In some embodiments, the second low signal level LOW2' is an intermediate voltage level which ranges from about the first low signal level LOW1' to about a logically high signal. In some embodiments, the first low signal level LOW1 is substantially equal to VSS. In some embodiments, the first low signal level LOW1' is substantially equal to VSS. In some embodiments, voltage VSS is substantially equal to ground. In some embodiments, the difference between the first low signal LOW1 and the second low signal LOW2 is substantially equal to the lifted voltage level ΔVw1' (e.g., as shown in FIGS. 12A, 12B and 12C). In some embodiments, the difference between the first low signal LOW1' and the second low signal LOW2' is substantially equal to the data voltage difference ΔV (e.g., as shown in FIGS. 7A and 7B). In some embodiments, when read word line signal RWL transitions to a logically high signal, inverted read word line signal RWLB transitions to a logically low signal, and voltage control unit 1100*a* switches off (e.g., NMOS transistor N5 shown in FIGS. 13A and 13B) which allows the word line signal WL to reach the first low signal level LOW1.

At time T5, curve 1404*b* (e.g., write word line signal WWL) finishes transitioning to first low signal level LOW1. At time T5, curve 1406*b* (e.g., signal at node C of cross-coupled inverters 302) finishes transitioning to first low signal level LOW1'.

At time T6, curve 1402 (e.g., read word line signal RWL) finishes transitioning to a logically high signal. At time T6, curve 1404*b* (e.g., write word line signal WWL) transitions from first low signal level LOW1 to a logically high signal. At time T6, curve 1406*b* (e.g., signal at node C of cross-coupled inverters 302) transitions from first low signal level LOW1' to a logically high signal. At time T6, curve 1412*b* (e.g., read bit line signal RBL is a "0") finishes transitioning to a logically high signal. In some embodiments, from time T1 through T6, a voltage difference ΔVrb1' is observed between curve 1410 and curve 1412*b*. In some embodiments, the voltage difference ΔVrb1' represents the voltage level difference associated with observing a logical "0" and a logical "1" in memory cell 204.

At time T7, curve 1404*b* (e.g., write word line signal WWL) finishes transitioning to a logically high signal. At time T7, curve 1406*b* (e.g., signal at node C of cross-coupled inverters 302) finishes transitioning to a logically high signal.

As shown in FIGS. 14A and 14B, by controlling the timing of the rising edge or the falling edge of the read word line signal RWL, the value of the write word line signal WWL or the signal at node C of cross-coupled inverters 302 are similarly controlled. As shown in FIGS. 14A and 14B, by controlling the pulse width of read word line signal RWL, the length of time the write word line signal WWL is raised or lifted up to the second low signal LOW2 is controlled. Similarly, by controlling the pulse width of read word line signal RWL, the length of time the signal at node C of cross-coupled inverters 302 is raised or lifted up to the second low signal LOW2' is controlled. As shown in FIGS. 14A and 14B, by controlling the signal at node C of cross-coupled inverters 302 or the read word line RWL, the read bit line signal RBL is controlled. As shown in FIGS. 14A and 14B, the read bit line signal RBL (e.g., curve 1412*b*) transitions slower to the logically high level, when compared with the read bit line signal RBL (e.g., curve 1412*a*) resulting in a voltage difference ΔVrb1' that is greater than the voltage difference ΔVrb1. In some embodiments, a voltage difference ΔVrb1' that is greater than the voltage difference ΔVrb1 results in improved static noise margin and logical "0" read detection by memory cells.

Figure 15:
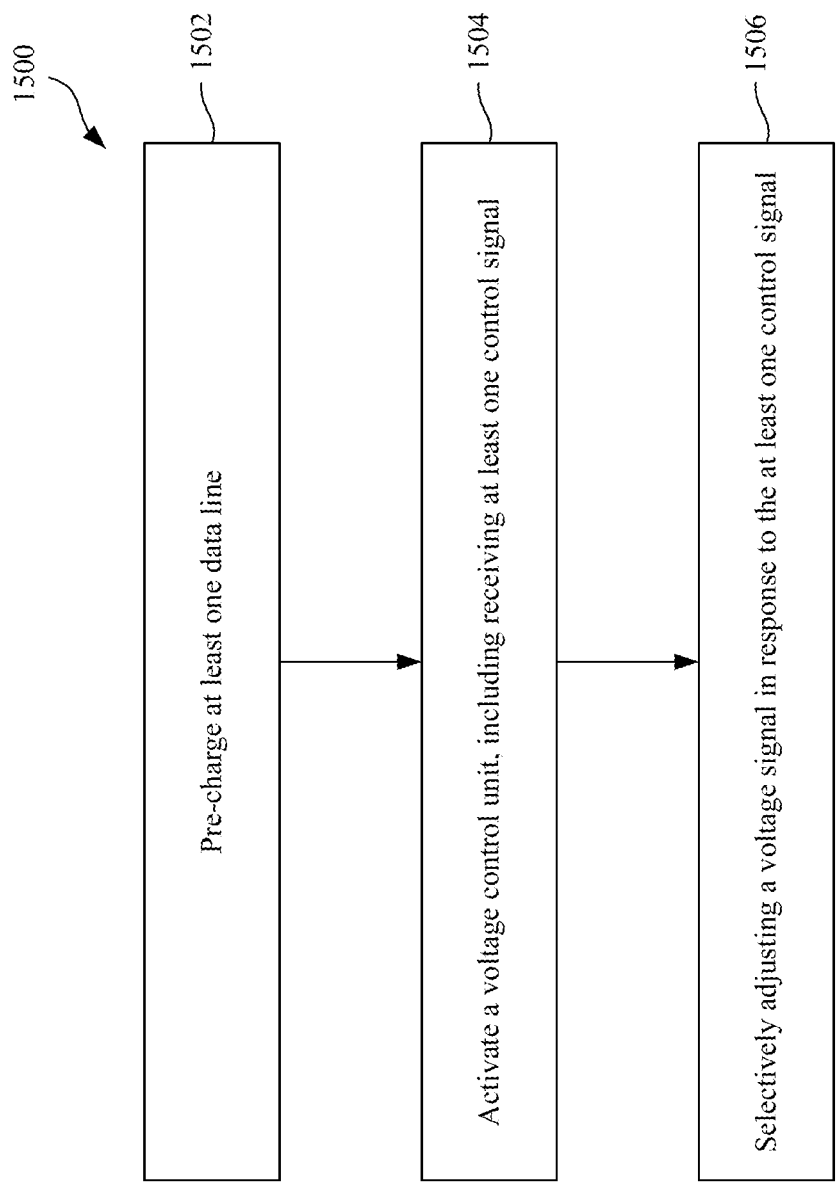
FIG. 15 is a flow chart of a method of controlling an SRAM in accordance with some embodiments.

FIG. 15 is a flow chart of a method 1500 of controlling an SRAM in accordance with some embodiments. Method 1500 begins with pre-charging at least one data line in operation 1502. Pre-charging at least one data line comprises setting a voltage level on the at least one data line to a reference voltage. In some embodiments, the reference voltage includes a logically high signal. In some embodiments, the reference voltage includes a logically low signal.

In some embodiments, the at least one data line includes word line WL (e.g., word line WL 206 shown in FIG. 2A, word line WL 316 shown in FIG. 3A, first word line A_WL 316a and second word line B_WL 328 shown in FIG. 3B, write word line WWL 316' shown in FIGS. 3C and 13A-13B, word lines WL 206, . . . , WL 508 shown in FIGS. 5, 8A, 10, 11A-11C, read word line RWL 328' shown in FIGS. 3A and 13B, and read word lines RWL 812, . . . , RWL 814 shown in FIG. 8B).

In some embodiments, the at least one data line includes bit line BL (e.g., bit line BL 208 shown in FIG. 2A, bit line BL 318 shown in FIG. 3A, first bit line A_BL 318a and second bit line B_BL 318b shown in FIG. 3B, write bit line WBL 318' shown in FIG. 3C, read bit line RBL 326' shown in FIG. 3C).

In some embodiments, the at least one data line includes bit line bar BLB (e.g., bit line bar BLB 210 shown in FIG. 2A, bit line bar BLB 320 shown in FIG. 3A, first bit line bar A_BLB 320a and second bit line bar B_BLB 326 shown in FIG. 3B, and write bit line bar WBLB 320' shown in FIG. 3C)

In some embodiments, the at least one data line includes data line CV (e.g., CV line 504 shown in FIG. 5).

Method 1500 continues with operation 1504 in which a voltage control unit is activated. In some embodiments, the voltage control unit is voltage control unit 214 (shown in FIG. 2A). In some embodiments, the voltage control unit is voltage control unit 214' (shown in FIG. 2B). In some embodiments, the voltage control unit is voltage control unit 502 (shown in FIG. 5). In some embodiments, the voltage control unit is voltage control unit 808 (shown in FIGS. 8A-8B). In some embodiments, the voltage control unit is voltage control unit 1002 (shown in FIG. 10). In some embodiments, the voltage control unit is voltage control unit 1100a (shown in FIG. 11A), voltage control unit 1100b (shown in FIG. 11B) or voltage control unit 1100c (shown in FIG. 11C).

In some embodiments, the activating the voltage control unit comprises receiving at least one control signal. In some embodiments, the activating the voltage control unit comprises sending at least one control signal.

In some embodiments, the at least one control signal includes first voltage control signal header_enb, second voltage control signal BBL_en or boosted voltage signal BVDD (shown in FIG. 4). In some embodiments, the at least one control signal includes first voltage signal RGV_EN, inverted first voltage signal RGV_ENB (shown in FIGS. 5, 6A-6B and 7A-7B). In some embodiments, the at least one control signal includes first voltage control signal footer_enb, second voltage control signal NWL_enb or negative word line signal NVSS (shown in FIGS. 8A-8B and 9). In some embodiments, the at least one control signal includes first signal EN (curves 1206a, 1206b, 1206c shown in FIGS. 10, 11A-11C and 12A-12C). In some embodiments, the at least one control signal includes read word line signal RWL (curve 1402 in FIGS. 13A-13B and 14A-14B) or the signal on data node C of cross-coupled inverters 302 (curve 1406b shown in FIG. 14B).

Method 1500 continues with operation 1506 in which the voltage control unit selectively adjusts a voltage signal in response to the at least one control signal. In some embodiments, the voltage signal comprises a first voltage signal or a second voltage signal. In some embodiments, selectively adjusting the voltage signal comprises selectively adjusting a voltage signal on a word line connected to the at least two p-type pass gates. In some embodiments, selectively adjusting the voltage signal comprises selectively adjusting a first voltage signal on a bit line connected to the memory cell and selectively adjusting a second voltage signal on a bit line bar connected to the memory cell.

In some embodiments, the voltage signal includes boosted voltage signal BVDD (curve 408 shown in FIG. 4) or bit line signal BL/bit line bar BLB (curves 410a, 410b shown in FIG. 4). In some embodiments, the voltage signal includes second voltage signal CVSS (curves 706a, 706b shown in FIG. 7A-7B). In some embodiments, the voltage signal includes the signal on data nodes C/T of cross-coupled inverters 302 (curves 708a, 708b, 710a, 710b shown in FIGS. 7A-7B). In some embodiments, the voltage signal includes negative word line signal NVSS (curve 908 in FIGS. 8A-8B and 9) or word line signal WL/RWL (curve 902 in FIGS. 8A-8B and 9). In some embodiments, the voltage signal includes word line signal WL/RWL (curves 1206a, 1206b, 1206c shown in FIGS. 10, 11A-11C and 12A-12C), write word line signal WWL/RWL (curve 1404b shown in FIG. 14B), the signal on data node C of cross-coupled inverters 302 (curve 1406b shown in FIG. 14B) or read bit line signal RBL (curve 1412b shown in FIG. 14B).

In some embodiments, the memory cell is a single-port memory cell, e.g., single-port memory cell 300a (FIG. 3A). In some embodiments, the memory cell is a two-port memory cell, e.g., two-port memory cell 300b (FIG. 3B). In some embodiments, the memory cell is a dual-port memory cell, e.g., dual-port memory cell 300c (FIG. 3C).

One of ordinary skill in the art would recognize that operations are able to be removed or that additional operations are able to be added to method 1500 without departing from the scope of this description. One of ordinary skill in the art would also recognize that an order of operations in method 1500 is able to be adjusted without departing from the scope of this description.

One aspect of this description relates to a static random access memory (SRAM). The SRAM includes a memory cell comprising at least two p-type pass gates. The SRAM also includes a first data line connected to the memory cell, a second data line connected to the memory cell and a voltage control unit connected to the first data line, wherein the voltage control unit is configured to control the memory cell.

Another aspect of this description relates to a semiconductor device including a static random access memory (SRAM). The SRAM includes a memory cell comprising at least two p-type pass gates. The SRAM also includes a bit line connected to the memory cell, a bit line bar connected to the memory cell, a word line connected to the memory cell and a voltage control unit connected to the memory cell, wherein the voltage control unit is configured to control the memory cell.

Still another aspect of this description relates to a method of controlling a static random access memory (SRAM). The method includes pre-charging at least one data line to a reference voltage, wherein the at least one data line is connected to a memory cell, wherein the memory cell comprises at least two p-type pass gates, activating a voltage control unit connected to the at least one data line, wherein the activating the voltage control unit comprises receiving at least one control signal and selectively adjusting a voltage signal in response to the at least one control signal.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) comprising:
    a memory cell, wherein the memory cell comprises at least two p-type pass gates;
    a bit line connected to the memory cell;
    a bit line bar connected to the memory cell;
    a word line connected to the memory cell;
    an n-type transistor connected between a ground voltage and a first node;
    a first inverter having an input terminal configured to receive a data signal and an output terminal connected to the word line, the first inverter being connected between a supply voltage and the first node; and
    a voltage control unit configured to control the N-type transistor and to control the memory cell by providing an operating voltage on the first node which affects operation of the first inverter and thereby causes a voltage on the word line to undergo at least a double transition including a first transition to the ground voltage and then a second transition to an intermediate voltage which is greater than the ground voltage but substantially lower than the supply voltage; and
    wherein:
        the voltage control unit includes a p-type capacitor-connected transistor connected to the first node and thereby to the word line; and
        the voltage control unit is further configured to selectively adjust voltages correspondingly of the bit line and the bit line bar.

2. The SRAM of claim 1, wherein each p-type pass gate of the at least two p-type pass gates has a three-dimensional gate structure.

3. The SRAM of claim 1, wherein:
    after the voltage on the word line undergoes the second transition from the ground voltage to the intermediate voltage, the voltage control unit is further configured to provide the operating voltage on the first node so as to further affect operation of the first inverter and thereby cause the voltage on the word line to undergo a third transition from the intermediate voltage to the ground voltage.

4. The SRAM of claim 1, wherein the voltage control unit further includes:
    series-connected inverters coupled between the p-type capacitor-connected transistor and a timing control unit.

5. The SRAM of claim 4, wherein:
    the voltage control unit is further configured to provide a signal on a second node between first and second ones of the series-connected inverters to a gate electrode of the N-type transistor.

6. The SRAM of claim 1, wherein:
    the memory cell is a single-port memory cell, a two-port memory cell or a dual-port memory cell.

7. A semiconductor device comprising:
    a static random access memory (SRAM) comprising:
        a memory cell, wherein the memory cell comprises at least two p-type pass gates;
        a bit line connected to the memory cell;
        a bit line bar connected to the memory cell;
        a word line connected to the memory cell;
        a word line driver including a first inverter having an input configured to receive a data signal and an output connected to the word line, the first inverter being connected between a supply voltage and an adjustment line;
        a voltage adjuster including an n-type transistor connected between a ground voltage and the adjustment line; and
        a voltage control unit connected to the memory cell, the voltage control unit being connected to the adjustment line and connected to the bit line by a second inverter and connected to the bit line bar by a third inverter, wherein the voltage control unit is configured to control the n-type transistor and to control the memory cell by providing an operating voltage on the adjustment line which affects operation of the first inverter and thereby causes a voltage on the word line to undergo at least a double transition including a first transition to the ground voltage and then a second transition to an intermediate voltage which is greater than the ground voltage but substantially lower than the supply voltage; and
        wherein the voltage control unit includes a p-type capacitor-connected transistor connected to the adjustment line; and
        the voltage control unit is further configured to selectively adjust voltages correspondingly of the bit line and the bit line bar.

8. The semiconductor device of claim 7, wherein the memory cell is a single-port memory cell or a dual-port memory cell.

9. The semiconductor device of claim 7, wherein the memory cell is a two-port memory cell.

10. The semiconductor device of claim 7, wherein each p-type pass gate of the at least two p-type pass gates has a three-dimensional gate structure.

11. The semiconductor device of claim 7, wherein:
    an output of the second inverter is configured to drive only the bit line, and is coupled to the bit line, and
    an output of the third inverter is configured to drive only the bit line bar, and is coupled to the bit line bar.

12. The semiconductor device of claim 7, wherein:
    after the voltage on the word line undergoes the second transition from the ground voltage to the intermediate voltage, the voltage control unit is further configured to provide the operating voltage on the adjustment line so as to further affect operation of the first inverter and thereby cause the voltage on the word line to undergo a third transition from the intermediate voltage to the ground voltage.

13. The semiconductor device of claim 7, wherein the voltage control unit further includes:

series-connected inverters coupled between the p-type capacitor-connected transistor and a timing control unit.

14. The semiconductor device of claim 13, wherein:
the voltage control unit is further configured to provide a signal on a node between first and second ones of the series-connected inverters to a gate electrode of the N-type transistor.

15. A method of controlling a static random access memory (SRAM), the method comprising:
pre-charging a word line to a reference voltage, wherein the word line is connected to a memory cell, wherein the memory cell comprises at least two p-type pass gates which connect the memory cell correspondingly to a bit line and a bit line bar;
activating a voltage control unit connected to the word line by a series connection of a p-type capacitor-connected transistor and a first inverter, the first inverter having an input terminal configured to receive a data signal and an output terminal connected to the word line, the first inverter being connected between a supply voltage and a first node;
wherein the activating the voltage control unit comprises:
outputting a first control signal from a second inverter included in the voltage control unit to a voltage adjuster, the voltage adjuster including an n-type transistor connected between a ground voltage and the first node; and
controlling the voltage adjuster in response to the first control signal, the controlling the voltage adjuster including:
selectively adjusting a first data signal on the bit line connected to the memory cell;
selectively adjusting a second data signal on the bit line bar connected to the memory cell; and
affecting operation of the first inverter and which thereby causes a voltage on the word line to undergo at least a double transition including a first transition to the ground voltage and then a second transition to an intermediate voltage which is greater than the ground voltage but substantially lower than the supply voltage.

16. The method of claim 15, wherein:
after the voltage on the word line undergoes the second transition from the ground voltage to the intermediate voltage, the controlling the voltage adjuster further causes the voltage on the word line to undergo a third transition from the intermediate voltage to the ground voltage.

17. The method of claim 15, wherein:
the voltage control unit further includes:
series-connected inverters coupled between the p-type capacitor-connected transistor and a timing control unit, the series-connected inverters including the second inverter; and
the activating a voltage control unit includes:
receiving a second control signal from the timing control unit; and
using the series-connected inverters to provide a delayed version of the second control signal as the first control signal.

18. The method of claim 15, wherein:
the voltage control unit further includes:
series-connected inverters coupled between the p-type capacitor-connected transistor and a timing control unit, the series-connected inverters including the second inverter; and
the controlling the voltage adjuster further includes:
using the series-connected inverters to provide a delayed version of the control signal to a gate electrode of the N-type transistor as the first control signal.

19. The method of claim 18, wherein the using the series-connected inverters to provide a delayed version of the control signal to a gate electrode of the N-type transistor includes:
using a signal on a second node between first and second ones of the series-connected inverters as the delayed version of the control signal.

20. The method of claim 15, wherein:
the memory cell is a single-port memory cell, a two-port memory cell or a dual-port memory cell.

* * * * *